(12) United States Patent
Schroeder et al.

(10) Patent No.: US 9,082,911 B2
(45) Date of Patent: Jul. 14, 2015

(54) THREE-DIMENSIONAL METAMATERIAL DEVICE WITH PHOTOVOLTAIC BRISTLES

(71) Applicant: Q1 Nanosystems Corporation, Sacramento, CA (US)

(72) Inventors: Mark R Schroeder, Hollister, CA (US); Robert M Smith, Placerville, CA (US)

(73) Assignee: Q1 Nanosystems Corporation, Sacramento, CA (US)

( * ) Notice: Subject to any disclaimer, the term of this patent is extended or adjusted under 35 U.S.C. 154(b) by 0 days.

(21) Appl. No.: 13/751,914

(22) Filed: Jan. 28, 2013

(65) Prior Publication Data

US 2014/0209155 A1    Jul. 31, 2014

(51) Int. Cl.
*H01L 31/00* (2006.01)
*H01L 31/0352* (2006.01)
*H01L 31/18* (2006.01)
*H01L 31/0236* (2006.01)

(52) U.S. Cl.
CPC .. *H01L 31/035281* (2013.01); *H01L 31/02363* (2013.01); *H01L 31/18* (2013.01); *Y02E 10/50* (2013.01)

(58) Field of Classification Search
CPC .................. H01L 31/02363; H01L 31/035281; H01L 31/18; Y02E 10/52
USPC .................................................. 136/255–256
See application file for complete search history.

(56) References Cited

U.S. PATENT DOCUMENTS

| | | | |
|---|---|---|---|
| 3,150,999 A | 9/1964 | Rudenberg et al. | |
| 3,969,746 A | 7/1976 | Kendall et al. | |
| 4,099,986 A | 7/1978 | Diepers | |
| RE29,833 E | 11/1978 | Mlavsky | |
| 4,155,781 A | 5/1979 | Diepers | |
| 4,234,352 A | 11/1980 | Swanson | |
| 4,454,372 A | 6/1984 | Appleby | |
| 4,816,082 A | 3/1989 | Guha et al. | |
| 5,178,685 A | 1/1993 | Borenstein et al. | |
| 5,238,519 A | 8/1993 | Nath et al. | |
| 5,371,470 A | 12/1994 | Jeng | |
| 5,411,897 A | 5/1995 | Harvey et al. | |
| 5,476,553 A | 12/1995 | Hanoka et al. | |
| 5,916,375 A | 6/1999 | Agui et al. | |

(Continued)

FOREIGN PATENT DOCUMENTS

| CN | 1855552 A | 11/2006 |
|---|---|---|
| EP | 1703 569 A2 | 9/2006 |

(Continued)

OTHER PUBLICATIONS

Kayes et al., "Comparison of the device physics principles of planar and radial p-n junction nanorod solar cells" Journal of Applied Physics 97, American Institute of Physics 2005.

(Continued)

*Primary Examiner* — Tamir Ayad

(74) *Attorney, Agent, or Firm* — The Marbury Law Group, PLLC

(57) ABSTRACT

The systems, methods, and devices of the various embodiments provide a photovoltaic cell made up of an array of photovoltaic bristles. The photovoltaic bristles may be configured individually and in an array to have a high probability of photon absorption. The high probability of photon absorption may result in high light energy conversion efficiency.

19 Claims, 26 Drawing Sheets

(56) References Cited

U.S. PATENT DOCUMENTS

| | | |
|---|---|---|
| 5,928,439 A | 7/1999 | Ota et al. |
| 6,033,928 A | 3/2000 | Eriguchi et al. |
| 6,087,197 A | 7/2000 | Eriguchi et al. |
| 6,337,283 B1 | 1/2002 | Verlinden et al. |
| 6,372,538 B1 | 4/2002 | Wendt et al. |
| 6,372,980 B1 | 4/2002 | Freundlich |
| 6,383,923 B1 | 5/2002 | Brown et al. |
| 6,423,568 B1 | 7/2002 | Verlinden et al. |
| 6,448,105 B1 | 9/2002 | Sterk |
| 6,468,828 B1 | 10/2002 | Glatfelter et al. |
| 6,518,494 B1 | 2/2003 | Shibuya et al. |
| 6,548,751 B2 | 4/2003 | Sverdrup, Jr. et al. |
| 6,559,479 B1 | 5/2003 | Ludemann |
| 6,583,349 B2 | 6/2003 | Tanaka |
| 6,620,996 B2 | 9/2003 | Sugawara et al. |
| 6,638,823 B2 | 10/2003 | Cho et al. |
| 6,649,824 B1 | 11/2003 | Den et al. |
| 6,660,930 B1 | 12/2003 | Gonsiorawski |
| 6,852,920 B2 | 2/2005 | Sager et al. |
| 6,872,450 B2 | 3/2005 | Liu et al. |
| 6,872,645 B2 | 3/2005 | Duan et al. |
| 6,878,871 B2 | 4/2005 | Scher et al. |
| 6,882,051 B2 | 4/2005 | Majumdar et al. |
| 6,936,865 B2 * | 8/2005 | Tonooka .................. 257/103 |
| 6,946,597 B2 | 9/2005 | Sager et al. |
| 7,051,945 B2 | 5/2006 | Empedocles et al. |
| 7,064,372 B2 | 6/2006 | Duan et al. |
| 7,067,867 B2 | 6/2006 | Duan et al. |
| 7,083,104 B1 | 8/2006 | Empedocles et al. |
| 7,135,350 B1 | 11/2006 | Smith et al. |
| 7,253,017 B1 | 8/2007 | Roscheisen et al. |
| 7,265,037 B2 | 9/2007 | Yang et al. |
| 7,589,880 B2 | 9/2009 | Kempa et al. |
| 7,649,665 B2 | 1/2010 | Kempa et al. |
| 7,754,964 B2 | 7/2010 | Kempa et al. |
| 7,847,180 B2 | 12/2010 | Argo et al. |
| 7,943,847 B2 | 5/2011 | Kempa et al. |
| 2002/0011641 A1 | 1/2002 | Oswald et al. |
| 2002/0130311 A1 | 9/2002 | Lieber et al. |
| 2002/0175408 A1 | 11/2002 | Majumdar et al. |
| 2003/0041894 A1 | 3/2003 | Sverdrup, Jr. et al. |
| 2004/0018525 A1 | 1/2004 | Wirtz et al. |
| 2004/0025933 A1 | 2/2004 | Chittibabu et al. |
| 2004/0025934 A1 | 2/2004 | Chittibabu et al. |
| 2004/0060591 A1 | 4/2004 | Den |
| 2004/0063320 A1 | 4/2004 | Hollars |
| 2004/0075464 A1 | 4/2004 | Samuelson et al. |
| 2004/0112421 A1 | 6/2004 | Spivack et al. |
| 2004/0123896 A1 | 7/2004 | Lemmon et al. |
| 2004/0144420 A1 | 7/2004 | Takeyama et al. |
| 2004/0144985 A1 | 7/2004 | Zhang et al. |
| 2004/0146560 A1 | 7/2004 | Whiteford et al. |
| 2004/0250848 A1 | 12/2004 | Sager et al. |
| 2005/0040374 A1 | 2/2005 | Chittibabu et al. |
| 2005/0079659 A1 | 4/2005 | Duan et al. |
| 2005/0098204 A1 | 5/2005 | Roscheisen et al. |
| 2005/0098205 A1 | 5/2005 | Roscheisen et al. |
| 2005/0121068 A1 | 6/2005 | Sager et al. |
| 2005/0126628 A1 | 6/2005 | Scher et al. |
| 2005/0161662 A1 | 7/2005 | Majumdar et al. |
| 2005/0181587 A1 | 8/2005 | Duan et al. |
| 2005/0189015 A1 | 9/2005 | Rohatgi et al. |
| 2005/0217717 A1 | 10/2005 | Faris |
| 2005/0224790 A1 | 10/2005 | Jin et al. |
| 2006/0006463 A1 | 1/2006 | Islam et al. |
| 2006/0024438 A1 | 2/2006 | Ku et al. |
| 2006/0038182 A1 | 2/2006 | Rogers et al. |
| 2006/0151820 A1 | 7/2006 | Duan et al. |
| 2006/0207647 A1 | 9/2006 | Tsakalakos et al. |
| 2007/0025139 A1 | 2/2007 | Parsons |
| 2007/0029561 A1 | 2/2007 | Cho et al. |
| 2007/0036951 A1 | 2/2007 | Nguyen et al. |
| 2007/0079867 A1 * | 4/2007 | Chittibabu et al. ............ 136/252 |
| 2007/0137697 A1 | 6/2007 | Kempa et al. |
| 2007/0235714 A1 | 10/2007 | Kwon et al. |
| 2007/0240757 A1 | 10/2007 | Ren et al. |
| 2008/0107799 A1 * | 5/2008 | Lu et al. .................... 427/74 |
| 2008/0169017 A1 * | 7/2008 | Korevaar et al. ............ 136/249 |
| 2008/0178924 A1 * | 7/2008 | Kempa et al. ................ 136/244 |
| 2008/0251122 A1 | 10/2008 | Ready |
| 2008/0302418 A1 * | 12/2008 | Buller et al. ................ 136/259 |
| 2009/0014066 A1 * | 1/2009 | Suezaki et al. ............... 136/258 |
| 2009/0194160 A1 | 8/2009 | Chin et al. |
| 2009/0211637 A1 | 8/2009 | Eaglesham |
| 2009/0250105 A1 | 10/2009 | Lee |
| 2010/0112748 A1 | 5/2010 | Vidu et al. |
| 2010/0282276 A1 * | 11/2010 | Kueper et al. .................. 134/6 |
| 2010/0319759 A1 | 12/2010 | Fisher et al. |
| 2011/0036395 A1 | 2/2011 | Argo et al. |
| 2011/0155236 A1 | 6/2011 | Goto et al. |
| 2011/0214709 A1 | 9/2011 | Evlsizer et al. |
| 2011/0253982 A1 | 10/2011 | Wang et al. |
| 2011/0308564 A1 | 12/2011 | Kempa et al. |
| 2012/0006390 A1 | 1/2012 | Huo et al. |
| 2013/0092223 A1 * | 4/2013 | Rampley et al. ............. 136/256 |

FOREIGN PATENT DOCUMENTS

| | | |
|---|---|---|
| JP | 53-31987 | 3/1978 |
| JP | 3-151672 | 6/1991 |
| JP | 4-296060 | 10/1992 |
| JP | 6104463 A | 4/1994 |
| JP | 6-342924 | 12/1994 |
| JP | 9-118511 | 5/1997 |
| JP | 9237907 A | 9/1997 |
| JP | 2006261666 A2 | 9/2006 |
| JP | 2008-053730 A | 3/2008 |
| KR | 2005-0004360 | 1/2005 |
| KR | 10-2011-0068216 A | 6/2011 |
| WO | 20041044948 A2 | 5/2004 |
| WO | 20071040594 A2 | 4/2007 |
| WO | 2008/048233 A2 | 4/2008 |
| WO | 2010/151556 A1 | 12/2010 |

OTHER PUBLICATIONS

Kayes, Brendan "Radial P-N Junction Nanorod Solar Cells" Applied Physics Candidacy Presentation Sep. 7, 2004.
Final Office Action Summary from U.S. Appl. No. 12/508,815 dated May 30, 2012.
Non-Final Office Action Summary from U.S. Appl. No. 12/911,657 dated Feb. 6, 2012.
Restriction/Election Requirement from U.S. Appl. No. 12/508,815 dated Aug. 2, 2011.
PCT International Preliminary Report on Patentability from application No. PCT/US2010/039552 dated Jan. 12, 2012.
"Konarka: Vision and Mission" 2011 Konarka Technologies, Inc., www.konarkatech.com/aboutl, 2 pages.
Glaeser, Andreas M., "Model studies of Rayleigh instabilities via microdesigned interfaces," Lawrence Berkeley National Laboratory, Oct. 17, 2000, 39 pages.
Non-Final Office Action Summary from U.S. Appl. No. 12/508,815 dated Nov. 10, 2011.
Sharma et al., "Diameter control of Ti-catalyzed silicon nanowires," 2004 Elsevier B.V., Journal of Crystal Growth, vol. 267, www.sciencedirect.com, pp. 613-618.
PeriodicTable.com, Technical Data for Palladium, available at http://www.periodictable.com/Elements/046/data.html, last visited Nov. 18, 2009.
Restriction Requirement from U.S. Appl. No. 12/911,657 dated Sep. 1, 2011.
Office Action Summary from Japanese Application No. 2008-540018 dated Oct. 4, 2011 (no translation).
Office Action Summary from Japanese Application No. 2008-540017 dated Sep. 27, 2011 (no translation).
Rumpler, Jr., "Optoelectric Integration Using The Magnetically Assisted Statistical Assembly Technique: Initial Magnetic Characterization and Process Development," MIT Thesis, Department of Electrical Engineering and Computer Science, Sep. 5, 2002, 102 pages.

(56) References Cited

OTHER PUBLICATIONS

Notice of Allowance and Fee(s) Due from U.S. Appl. No. 11/466,411 dated Oct. 6, 2010.
International Preliminary Report of Patentability from PCT Application No. PCT/US06/32987 mailed Jul. 22, 2009.
International Search Report and Written Opinion from PCT Application No. PCT/US06/32986 mailed on Sep. 10, 2008.
Peng et al., "Aligned Singel-Crystalline Si Nanowire Arrays for Photovoltaic Applications" www3.interscience.wiley.com/journal/111081086/abstract?CRETRY=1&SRETRY=>.
Gaire et al., "Mechanical Testing of Isolated Amorphous Silicon Slanted Nanorods" Journal of Nanoscience and Nanotechnology, vol. 5,1893-1897, 2005.
Kayes et al., "Synthesis and Characterization of Silicon Nanorod Arrays for Solar Cell Applications", Cal Tech Disclosure; May 19, 2006.
Y. Zhang et al., "Coaxial Nanocable: Silicon Carbide and Silicon Oxide Sheathed with Boron Nitride and Carbon", www.sciencemag.org, Science vol. 281, Aug. 14, 1998.
PeriodicTable.com, Technical Data for Gold, available at http://www.peridioctable.com/Elements/079/data.html (last visited Nov. 18, 2009).
PeriodicTable.com, Technical Data for Tellurium, available at http://www.periodictable.com/Elements/052/data.html (last visited Nov. 18, 2009).
Encyclopedia Britannica, Shear Modulus, available at http://www.britannica.com/EBchecked/topic/539275/shear-modulus (last visited Feb. 25, 20103).
Stroeve et al. 2004, Fabrication of Nanocables by Electrochemical Depostiion Inside Metal Nanotubes, J. Am. Chem. Soc., 2004, 126: 15022-15023.
Stroeve et al. 2005, Modeling Electrochemcial Deposition inside Nanotubes to Obtain Metal-Semiconductor Multiscale Nanocables or Concial Nanopores, J. Phys. Chem. B, 2005, 109: 14523-14528.
Xia et al., Ag Nanowires Coated with Ag/Pd Alloy Sheaths and Their Use as Substrates for Reversible Absorption and Desportion of Hydrogen, J. Am. Chem. Soc. 2004, 126: 5940-5941.
PeriodicTable.com, Technical Data for Silver, available at http://www.peridioctable.com/Elements/047/data.html (last visited Nov. 18, 2009).
Solar Electrical System Sizing Sheet, Go Solar®, www.solarexpert.com/Pvinsolation.html, downloaded Mar. 2, 2011.
Karpov et al., "Physics of CdTe Photovoltaics: From Front to Back," Invited talk F10.1, MRS Spring Meeting, Mar. 28-Apr. 1, 2005, San Francisco, CA, pp. 1-12.
Kayes et al., "Radial PN Junction Nanorod Solar Cells: Device Physics Principles and Routes to Fabrication in Silicon," Photovoltaic Specialists Conference, Aug. 8, 2005.
Non-Final Office Action Summary from U.S. Appl. No. 11/466,416 dated Feb. 17, 2012.
Final Office Action Summary from U.S. Appl. No. 11/466,416 dated May 26, 2011.
Restriction Requirement from U.S. Appl. No. 11/466,411 dated Jun. 24, 2009.
Restriction Requirement from U.S. Appl. No. 11/466,411 dated Nov. 9, 2009.
Non-Final Office Action Summary from U.S. Appl. No. 11/466,411 dated Nov. 27, 2009.
Non-Final Office Action Summary from U.S. Appl. No. 11/466,416 dated Dec. 23, 2010.
International Search Report and Written Opinion from PCT Application No. PCT/US2010/039552 dated Aug. 18, 2010.
Restriction Requirement from U.S. Appl. No. 11/466,416 dated Aug. 5, 2009.
Non-Final Office Action Summary from U.S. Appl. No. 11/466,416, dated Dec. 9, 2009.
Final Office Action Summary from U.S. Appl. No. 11/466,411, dated Jun. 8, 2010.
International Search Report and Written Opinion from PCT Application No. PCT/US06/32987 dated Jul. 18, 2008.
Wagner et al., Band-gap narrowing in heavily doped silicon: a comparison of optical and electrical data, Journal of Applied Physics, vol. 63, No. 2, pp. 425-429, Jan. 15, 1998.
Darius Snieckus; "A different dimension"; US Solar, innovation; www.rechargenews.com; Feb. 4, 2011.
Indium Tin Oxide: Material Property Database; http://www.mit.edu/~6.777/matprops/ito.htm; accessed May 14, 2014.
John David Jackson; Professor of Physics, University of Illinois; Classical Electrodynamics; John Wiley & Sons, Inc.1998.
Optical Constants of IN O—SnO (ITO, Indium Tin Oxide); Refractive index of In2O3—SnO2 (ITO, Indium tin oxide) [Crystals etc.]—Refractive Index INFO; http://refractiveindex.info/legacy/?group=CRYSTALS&material=ITO; accessed on May 14, 2014.
Optical Constants of ZnO (Zinc Oxide); Refractive index of IZnO (Zinc Oxide) [Crystals etc.]—Refractive Index INFO; http://refractiveindex.info/legacy/?group=CRYSTALS&material=ZnO; accessed on May 14, 2014.
Jeong-Eun Kim et al.; Electrical and Optical Properties of Zinc Oxide Thin Films Deposited Using Atomic Layers Deposition; Journal of the Korean Ceramic Society; vol. 47, No. 4, pp. 353-356; 2010.
International Search Report and Written Opinion for International Application No. PCT/US2014/013456 mailed on Jan. 28, 2014.

\* cited by examiner

US 9,082,911 B2

THREE-DIMENSIONAL METAMATERIAL DEVICE WITH PHOTOVOLTAIC BRISTLES

FIELD

This application generally relates to photovoltaic devices, and more specifically to photovoltaic cells featuring a large number of photovoltaic bristles.

BACKGROUND

Solar energy is a popular clean energy, but it is generally more expensive than its carbon based competitors (e.g., oil, coal, and natural gas) and other traditional non-carbon based energy sources (e.g., hydropower). Typically, solar energy is also relatively expensive because traditional photovoltaic cells with a planar configuration have generally low total efficiency. Total efficiency is based upon the total power produced from a solar cell throughout the day as the sun transits across the sky. Total efficiency is different from the theoretical efficiency of converting to electricity a given amount of light energy striking the photovoltaic cells with a zero angle of incidence (e.g., the instant when the sun is directly above the solar cell).

SUMMARY

The systems, methods, and devices of the various embodiments provide a photovoltaic cell featuring a metamaterial formed from a plurality of photovoltaic bristles whose photovoltaic and conductive materials are configured to exhibit a high probability of photon absorption and internal reflection. As a result of the high probability of photon absorption and internal photon reflections, the metamaterial of photovoltaic bristles exhibits high total efficiency in converting light energy into electrical energy. The high total efficiency of the embodiment photovoltaic cells may lead to increased efficiency and more power generation from the photovoltaic cell.

The various embodiments also include structural features that may result in reduced resistance to electrical current when exposed to light sufficient to generate electrical potentials. Such enhanced conductivity may further efficiency and net power generated from the photovoltaic cell under certain operating conditions.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION

Figure 1A:
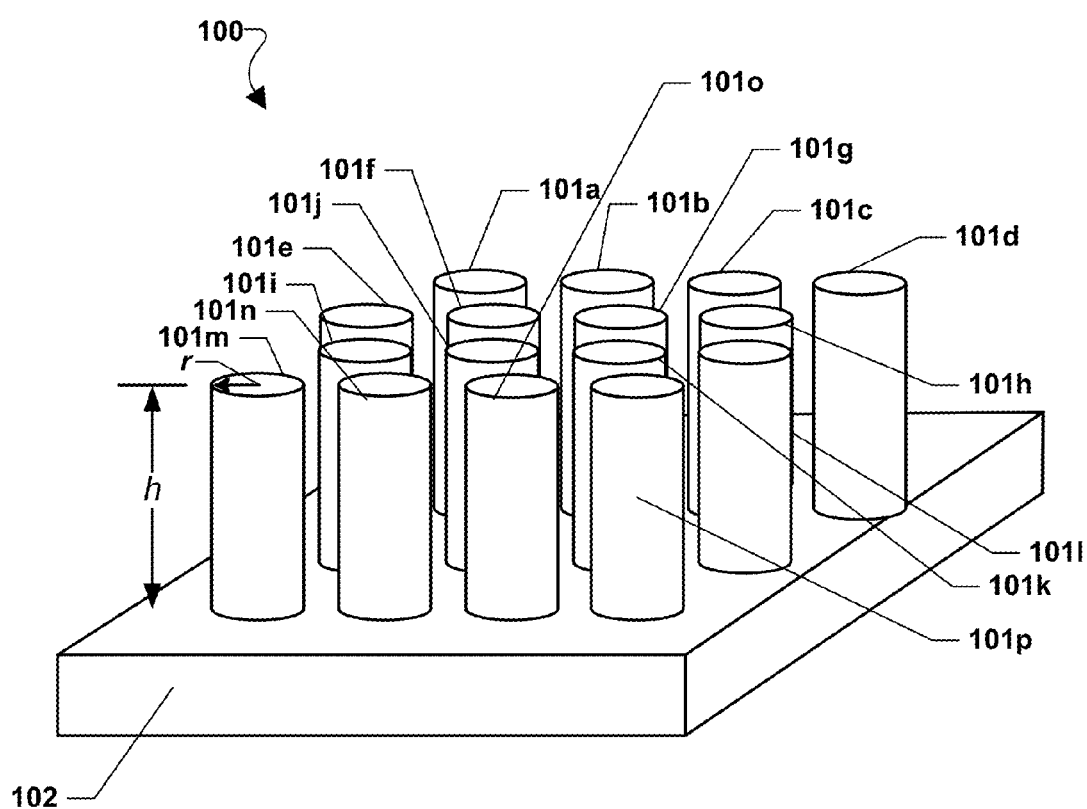
FIG. 1A is a perspective view of an number of photovoltaic bristles extending from a substrate to form a metamaterial according to an embodiment.

The various embodiments will be described in detail with reference to the accompanying drawings. Wherever possible, the same reference numbers will be used throughout the drawings to refer to the same or like parts. The terms "example," "exemplary," or any term of the like are used herein to mean serving as an example, instance, or illustration. References made to particular examples and implementations are for illustrative purposes, and are not intended to limit the scope of the invention or the claims. Any implementation described herein as an "example" is not necessarily to be construed as preferred or advantageous over another implementation.

As used herein, the term "photovoltaic bristle" refers to a three-dimensional structure approximately cylindrical with a height approximately equal to 1-100 microns, a diameter of approximately 0.2-50 microns that includes at least one photovoltaically-active semiconductor layer sandwiched between a conductive inner layer or core and a transparent outer conductive layer. The term "bristle" is used merely because the structures have a length greater than their diameter, the structures have a generally (on average) circular cross-section, and the overall dimensions of the structures are on the dimensions of sub-microns to tens of microns. In the embodiment illustrated herein the photovoltaic bristles have an approximately cylindrical, by which it is meant that a substantial portion of the exterior surface of the structures have a cross-section that is approximately circular or elliptical with both radii being approximately coexistent. Due to manufacturing variability, no single photovoltaic bristle may be exactly cylindrical in profile, but when considered over a large number of photovoltaic bristles the average profile is cylindrical. In another embodiment, the photovoltaic bristles may have a non-circular cross-section, such as hexagonal, octagonal, elliptical, etc. as may facilitate manufacturing.

When the embodiment photovoltaic bristles are arranged on a substrate in an order or disordered array, the resulting structure may form a metamaterial structure. As used herein, the term "metamaterial" or "metamaterial substrate" refers to an array of photovoltaic bristles on a substrate. Metamaterials as used herein are artificial materials that are engineered with metals or polymers that are arranged in a particular structured or non-structured pattern that result in material properties (including light absorption and refraction properties) that are different from the component materials. The cumulative effect of light interacting with the array of photovoltaic bristles may be affected by controlling the shape, geometry, size, orientation, material properties, material thicknesses, and arrangement of the bristles making up the metamaterial as described herein.

Traditional planar photovoltaic cells are flat. In traditional planar photovoltaic cells, a limited number of photons are absorbed at any given point in time. Photon absorption occurs through the thickness of the traditional planar photovoltaic cell (e.g., top-to-bottom) from the point of photon entry until the photon is converted to electrical energy. Traditional planar photovoltaic cells convert photons into electrical energy when photons interact with a photovoltaic layer. However, some photons pass through the photovoltaic layer without generating electron-hole pairs, and thus represent lost energy. While the number of photons absorbed may be increased by making the photovoltaic layer thicker, increasing the thickness increases the fraction of electron-hole pairs that recombine, converting their electrical potential into heat. Additionally, thicker photovoltaic films exhibit an exponential attenuation loss leading to a decrease in photon conversion. For this reason, traditional planar photovoltaic cells have emphasized thin photovoltaic layers, accepting the reduced photon-absorption rate in favor of increased conversion of electron-hole pairs into electrical current and reduced heating. The theoretical peak efficiency, as well as the total efficiency, of traditional planar photovoltaic cells is thus limited by the planar geometry and the un-attenuated fraction of photons that can be absorbed in a maximized optical path length through the photovoltaic layer.

Conventional planar photovoltaic cells also suffer from low total efficiency in static deployments (i.e., without sun tracking equipment), since their instantaneous power conversion efficiency decreases significantly when the sun is not directly overhead (i.e., before and after noon). Peak efficiencies of traditional planar photovoltaic cells are affected by their orientation with respect to the sun, which may change depending on the time of day and the season. The standard test conditions for calculating peak efficiencies of solar cells are based on optimum conditions, such as testing the photovoltaic cells at solar noon or with a light source directly above the cells. If light strikes traditional photovoltaic cells at an acute angle to the surface (i.e., other than perpendicular to the surface) the instantaneous power conversion efficiency is much less than the peak efficiency. Traditional planar photovoltaic cells in the northern hemisphere are typically tilted toward the south by an angle based on the latitude in order to improve their efficiency. While such fixed angles may account for the angle of the sun at noon due to latitude, the photovoltaic cells receive sun light at an angle during the morning and afternoon i.e., most of the day). Thus, traditional planar photovoltaic cells actually result in a low total efficiency and low total power generation when measured beyond a single moment in time.

The various embodiments include photovoltaic cells that exhibit metamaterial characteristics from regular or irregular arrays of photovoltaic bristles configured so the conversion of light into electricity occurs within layers of the photovoltaic bristles. Since the photovoltaic bristles extend above the surface of the substrate and are spaced apart, the arrays provide the photovoltaic cells of the various embodiments with volumetric photon absorption properties that lead to energy conversion performance that exceeds the levels achievable with traditional planar photovoltaic cells. The volumetric photon absorption properties enable the various embodiment photovoltaic cells to generate more power than traditional planar photovoltaic cells with the same footprint. Due to the small size of the photovoltaic bristles, the photovoltaically-active layers within each bristle are relatively thin, minimizing power losses due to electron-hole recombination. The thin photovoltaically-active layers help reduce attenuation losses normally present in thicker photovoltaic films because the photovoltaic bristles include a thin radial absorption depth and a relatively thicker vertical absorption depth maximizing photon absorption and power generation. When individual photovoltaic bristles are combined in an array on, or within, a substrate, a metamaterial structure may be formed that exhibits a high probability of photon absorption and internal reflection that leads to increased energy conversion efficiencies and power generation. Various embodiment structures also provide additional performance-enhancing benefits as will be described in more detail below.

The various embodiments include configurations for positioning photovoltaic bristles on a substrate with inter-bristle spacings dependent on the dimensions of each bristle that trade-off shadowing and photon absorption opportunities in order to increase the energy conversion performance. These embodiment configurations may be determined based upon specific dimensions, enabling a range of photovoltaic cell configurations depending upon the height and diameter of the photovoltaic bristles. Due to the small size of the photovoltaic bristles and the relatively short distance between bristles, the result may be a metamatrial in which light waves (i.e., photons when evaluated as waves instead of particles) exhibit a higher probability of interacting with and being absorbed by the materials of the photovoltaic bristles than occurs with conventional photovoltaic cells. Additionally the three-dimensional structure of the photovoltaic bristles increases the optical thickness of the metamaterial device. All of these factors increase the number of photons that are absorbed into the photovoltaicly-active layers of the photovoltaic bristles, and thus increase the amount of light energy that is available for conversion to electricity.

The various embodiments also include configurations of the conductive and photovoltaicly-active layers within each photovoltaic bristle in terms of thickness and index of refraction that provide enhanced power conversion performance by internally refracting photons absorbed within the bristles. As described in more detail below, photons may essentially reflect and propagate around the photovoltaic bristle's absorption annulus thereby developing an equilibrium standing wave. Photons that makeup the standing wave will be absorbed and converted into an electron hole pair. This circular internally reflecting photon path and the resulting standing wave is unique to the various embodiments, and a phenomenon that cannot occur in a conventional planar photovoltaic cell.

Further performance enhancements may be obtained by positioning the embodiment photovoltaic cells so that the photovoltaic bristles are at an angle to the incident photons. This can improve the probability that photons will be absorbed into the photovoltaic bristles due to wave interactions between photons and the outer conductive layer on each photovoltaic bristle. Orienting the embodiment photovoltaic cells at an angle to the incident photons also increases the optical depth of the photovoltaic bristles exposed to the light, since in such an orientation the photons strike the sides of the bristles and not just the tops. The off-axis photon absorbing characteristics of the photovoltaic bristles also enables the embodiment photovoltaic cells to exhibit significant total energy conversion efficiency for indirect and scattered light, thereby increasing the number of photons available for absorption compared to a conventional photovoltaic cell.

In a further effect resulting from the bristle-type structure of the various embodiments, increased amounts of current obtained from an embodiment photovoltaic cell has been found to result from decreases in the resistance of the transparent conductive layers during insolation. This may be caused in part by electric field concentrations that can develop at points of structural discontinuity within the arrays of photovoltaic bristles, which may lead to increased conductivity due to field effects similar to what happens in field effect transistors. Analysis and observations of prototypes indicates that this reduction in resistance increases as the thickness of the outer conductive layer increases. This decrease in resistance with decrease in outer conductive layer thickness runs counter to conventional wisdom which holds the opposite effect. Conventional photovoltaic cells teacher (incorrect word, replace with "utilize") relatively thick conductive oxide layers in order to reduce power losses due to excessive resistance in that layer. In the embodiment portable tape Brussels (remove this), thicker outer conductive layers are undesirable because they increase the minimum diameter of the bristles and reduce the packing density within the photovoltaic cell. Larger diameter photovoltaic bristles may exhibit lower photon absorption characteristics and reduce the photon absorbing characteristics of the metamaterial formed from arrays of such bristles. Thus, the observed reductions in resistance in photovoltaic bristles with thin outer conductive layers enables the design of more efficient embodiment photovoltaic cells by enabling the use of thin outer conductive layers, which may enable smaller diameter bristles and higher packing densities, all without increasing electrical losses due to increases in resistance of the thinner outer conductive layer.

The compound effect of all of these energy conversion performance improvements is high total energy efficiency and high total power generation. The total energy efficiency includes a higher peak performance at optimum conditions, but more importantly, it includes a higher sustained average efficiency over an entire day. This means that the embodiment solar cells may generate more power during a day by producing more power than conventional photovoltaic cells before and after solar noon. Thus, with production costs expected to be only slightly more expensive than conventional photovoltaic cells (which have benefited from decades of production refinements), the significant improvement in overall energy conversion performance of the various embodiments is expected to result in photovoltaic arrays that can be cost competitive with conventional electrical power generation technologies, such as coal and natural gas power plants.

FIG. 1A illustrates an embodiment photovoltaic cell 100 made up of an array of photovoltaic bristles 101a, 101b, 101c, 101d, 101e, 101f, 101g, 101h, 101i, 101j, 101k, 101l, 101m, 101n, 101o, 101p extending from a substrate 102. While illustrated with twelve photovoltaic bristles 101a-101p in FIG. 1A, a photovoltaic cell 100 may include a large number of photovoltaic bristles, which forms a metamaterial structure. The number of photovoltaic bristles 101 on any photovoltaic cell 100 will depend upon the dimensions and spacing of the bristles and the size of the cell. As with conventional photovoltaic cells, individual photovoltaic cells 100 may be assembled together in large numbers to form panels (i.e., solar panels) of a size that are suitable for a variety of installations.

Each photovoltaic bristle 101a-101p is characterized by its height "h," which is the distance that each bristle extends from the substrate 102. Photovoltaic bristles 101a-101p are also characterized by their radius "r". In an embodiment, all photovoltaic bristles 101a-101p within an array will have approximately the same height h and approximately the same radius r in order to facilitate manufacturing. However, in other embodiments, photovoltaic bristles 101a-101p within the array may be manufactured with different height and diameters.

In an embodiment, the number of photovoltaic bristles in a photovoltaic cell may depend upon the substrate surface area available within the cell and the packing density or inter-bristle spacing. As explained in more detail below, in an embodiment, photovoltaic bristles may be positioned on the substrate with a packing density or inter-bristle spacing that is determined based upon the bristle dimensions (i.e., h and r dimensions) as well as other parameters, and/or pattern variations. For example, a hexagonal pattern rather than the trigonomic pattern described, also metamaterial patterns of variations within the ordered arrays.

In the various embodiments, the dimensions and the inter-bristle spacing of photovoltaic bristles may be balanced against the shading of neighboring bristles. In other words, increasing the number of photovoltaic bristles may increase the surface area available for absorbing photons. However, each photovoltaic bristle casts a small shadow, so increasing the photovoltaic bristle density of a photovoltaic cell beyond a certain point may result in a significant portion of each bristle being shadowed by its neighbors. While such shadowing may not reduce the number of photons that are absorbed within the array, shadowing may decrease the number of photons that are absorbed by each photovoltaic bristle, and thus there may be a plateau in the photon absorption versus packing density of photovoltaic bristles. A further consideration beyond shadowing is the wave interaction effects of the array of closely packed photovoltaic bristles. The interior-bristle spacing may be adjusted to increase the probability that photons entering the array are absorbed by the photovoltaic bristles' metamaterial properties considering the bulk material properties of the layered films that makeup the array. For example, specific characteristics such as extinction coefficient or absorption path length may predict an optimal dimensional design, although one may chose to deviate from this prediction resulting in a sacrifice in performance.

Figure 1B:
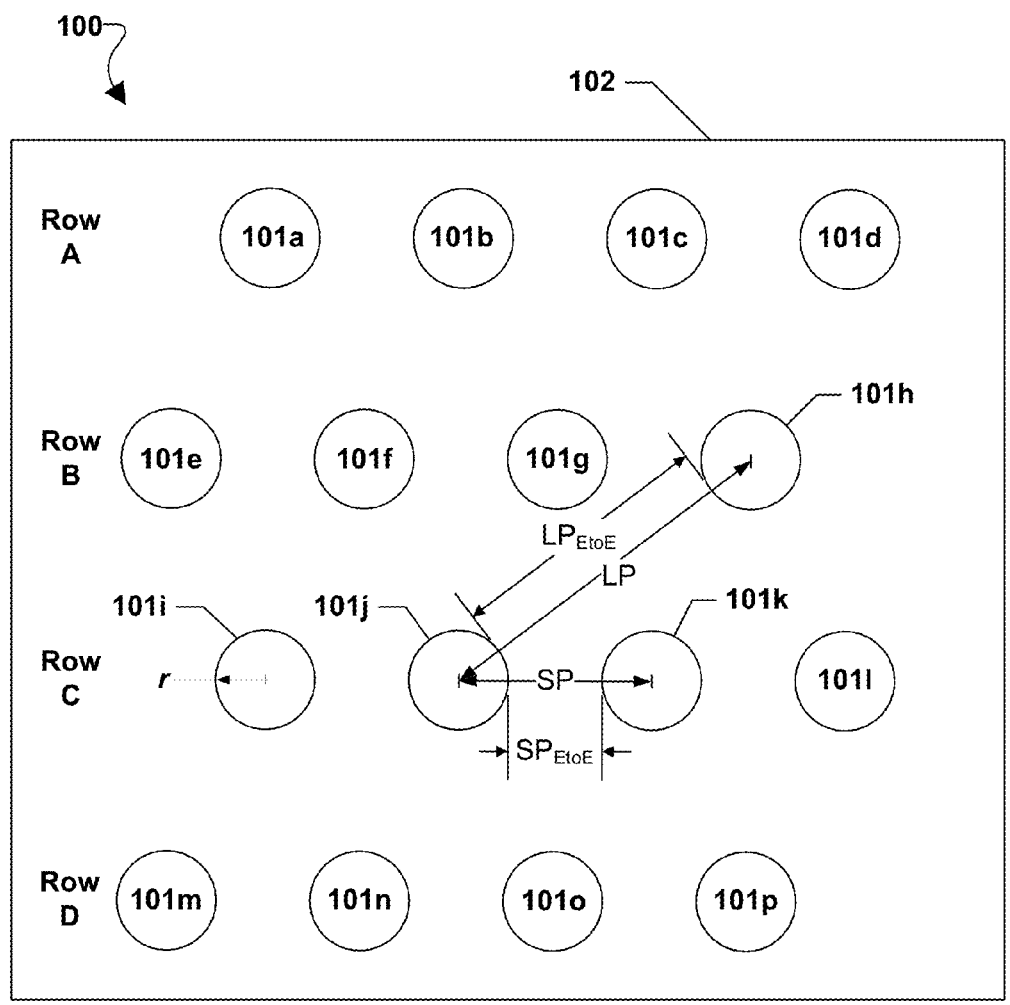
FIG. 1B is a top view of the photovoltaic bristles illustrated in FIG. 1A.

FIG. 1B shows a top view of the photovoltaic cell 100 illustrating the inter-bristle dimensions in an arbitrary arrangement of bristles. As will be further described below, the arrangement of bristles is shown as having a diamond or trapezoidal pattern, may also be any other ordered pattern (e.g., hexagonal pattern, octagonal pattern) or non-order pattern such as a swirl. As mentioned above, each photovoltaic bristle 101a-101p is characterized by a radius r that is measured from the center to the outer surface of the photovoltaic bristle 101a-101p. In an embodiment, the radius r of each photovoltaic bristle 101a-101p may be the same. In another embodiment, the radius r of the photovoltaic bristles may be different or vary.

In an embodiment, the array of photovoltaic bristles 101a-101p may be formed as rows A, B, C, D that are spaced apart on the substrate 102. While FIG. 1B illustrates just four rows of four photovoltaic bristles each, embodiment photovoltaic cells 100 will typically include large numbers of rows with each row including a large number of photovoltaic bristles, forming a metamaterial device.

The metamaterial configuration of the array of photovoltaic bristles, including the packing density of the photovoltaic bristles, may be defined in terms of inter-bristle dimensions. The distance between two neighboring photovoltaic bristles of the array of photovoltaic bristles 101a-101p may be described by their center-to-center spacing or edge-to-edge spacing. In a regular array, the distance between photovoltaic bristles may vary in different directions, so these distances may be referred to as the long pitch and the short pitch. The long pitch may be characterized in terms of the maximum center-to-center spacing, or Long Pitch (LP) or the maximum edge-to-edge spacing, Long Pitch edge-to-edge ($LP_{EtoE}$). The short pitch may be characterized in terms of the minimum center-to-center distance or Short Pitch (SP) or minimum edge-to-edge spacing, Short Pitch edge-to-edge ($SP_{EtoE}$). The center-to-center spacing of the photovoltaic bristles 101 may be in between SP and LP. In an embodiment, the array of photovoltaic bristles 101a-101p may be formed such that the edge-to-edge spacing of all respective neighboring photovoltaic bristles of the array of photovoltaic bristles 101a-101p may be greater than or equal to $SP_{EtoE}$ and less than or equal to $LP_{EtoE}$. The relationship between inter-bristle spacing, radii and height will be explained below beginning with reference to FIG. 2A.

As mentioned above, the height of the photovoltaic bristles above the substrate results in a metamaterial 3-D structure that exhibits greater electrical power generation for a given amount of insolation than can be expected from a conventional flat photovoltaic cell of the same area. Part of this effect is due to the depth of the structure over which photons interact with photovoltaically-active materials. This effect is illustrated in FIGS. 1C and 1D.

Figure 1C:
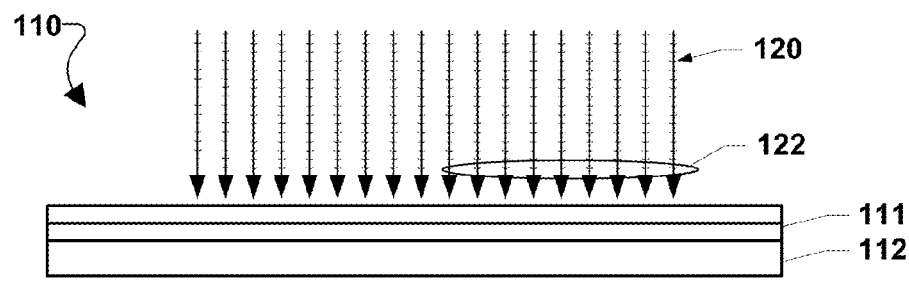
FIG. 1C is a cross-sectional view of a conventional photovoltaic device illustrating a wave front of photons.
Figure 1D:
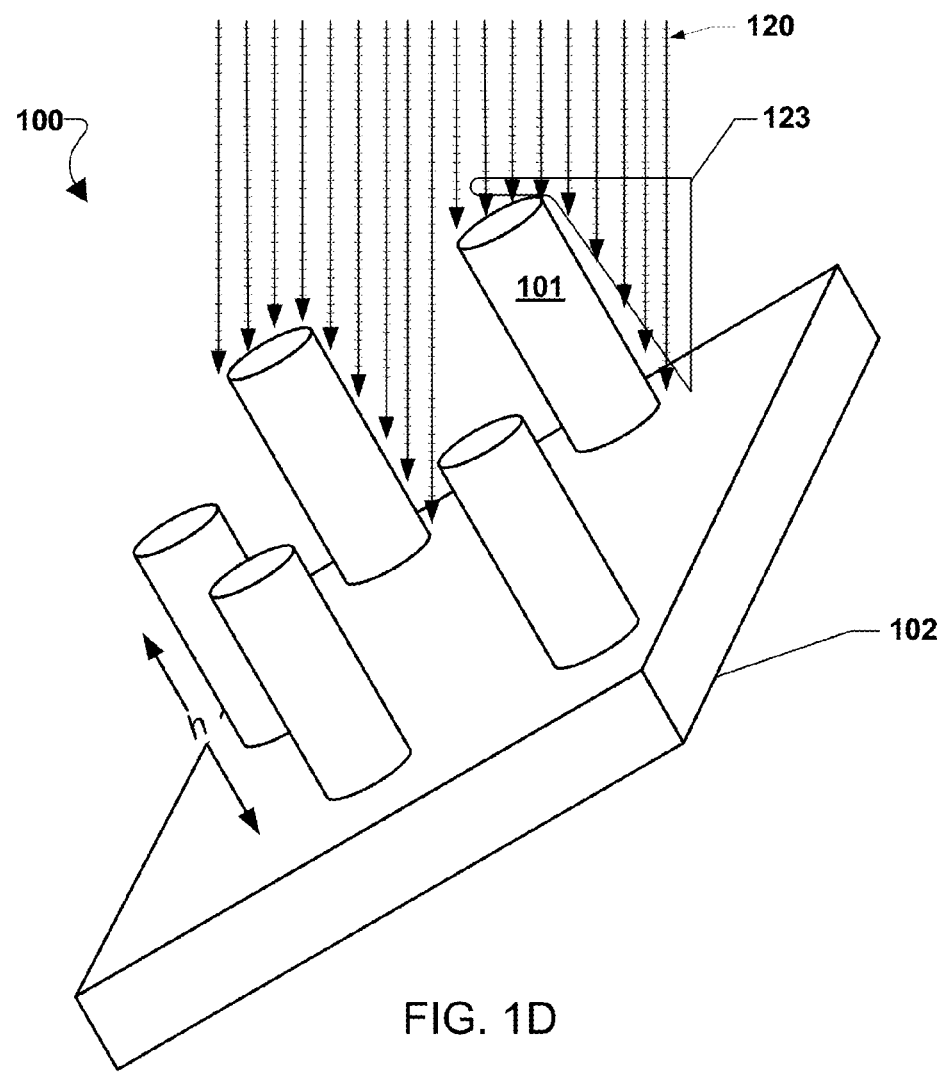
FIG. 1D is a perspective view of photovoltaic bristles illustrating photon interactions when an axis of the array of photovoltaic bristles is oriented at an angle to the incident photons.

As illustrated in FIG. 1C, a conventional photovoltaic cell 110 is generally planar with a photovoltaic active layer 111 applied to a planar substrate 112. Due to this planar architecture, incident light rays 120 strike a flat surface. Consequently, photon waves 122 are accurately represented in terms of a flux, which is a measure of the number of photons striking an area (i.e. flat surface) per unit time. Thus, energy conversion performance of conventional photovoltaic cells is measured against the incident photon energy measured as a flux, which is a two-dimensional measurement. Thus, the energy conversion efficiency of a conventional photovoltaic cell 110 is based upon the amount of electricity generated by unit area of the cell divided by the photon flux.

This measurement of the amount of light energy interacting with photovoltaic cells is not necessarily appropriate for embodiment photovoltaic cells 100 since it ignores the three-dimensional aspect resulting from the height dimension of photovoltaic bristles. This is illustrated in FIG. 1D, which shows incident light rays 120 striking the various surfaces presented to the light by the photovoltaic bristles 101. Specifically, incident photons 120 may interact with the surface of photovoltaic bristles 101 along their entire length. Thus, incident photons interact with the embodiment photovoltaic cells 100 throughout the depth of the array defined by the height of the photovoltaic bristles 101. Consequently, at any given instant, the number of photons interacting with the embodiment photovoltaic cells 100 is equal to the number of photons within the volume defined by a unit area times the height of the photovoltaic bristles 101 less the subtended angle reduction. The shadow from an eclipsing neighboring photovoltaic bristle reduces the number of photons interacting within the metamaterial and may vary depending on the tilt of the metamaterial. Even with the subtended angle reduction, this volumetric effect means that there are more photons available for interacting with the photovoltaic bristles 101 in embodiment photovoltaic cells 100 than is possible with conventional planar photovoltaic cells 110.

Figure 2A:
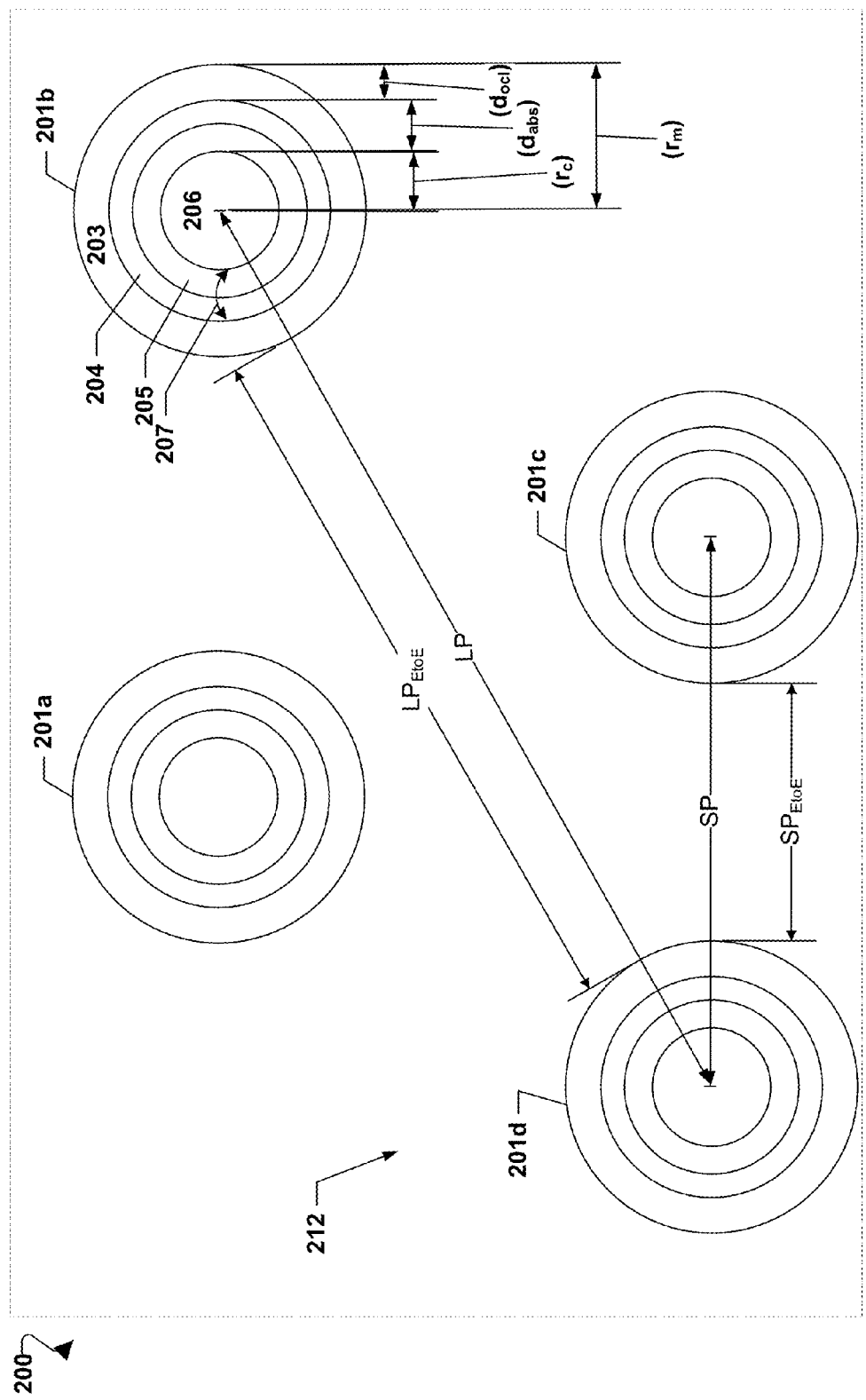
FIG. 2A is a cross-sectional top view of a section of an embodiment in which the photovoltaic bristles have a conductive core and two absorber sublayers or regions.
Figure 2B:
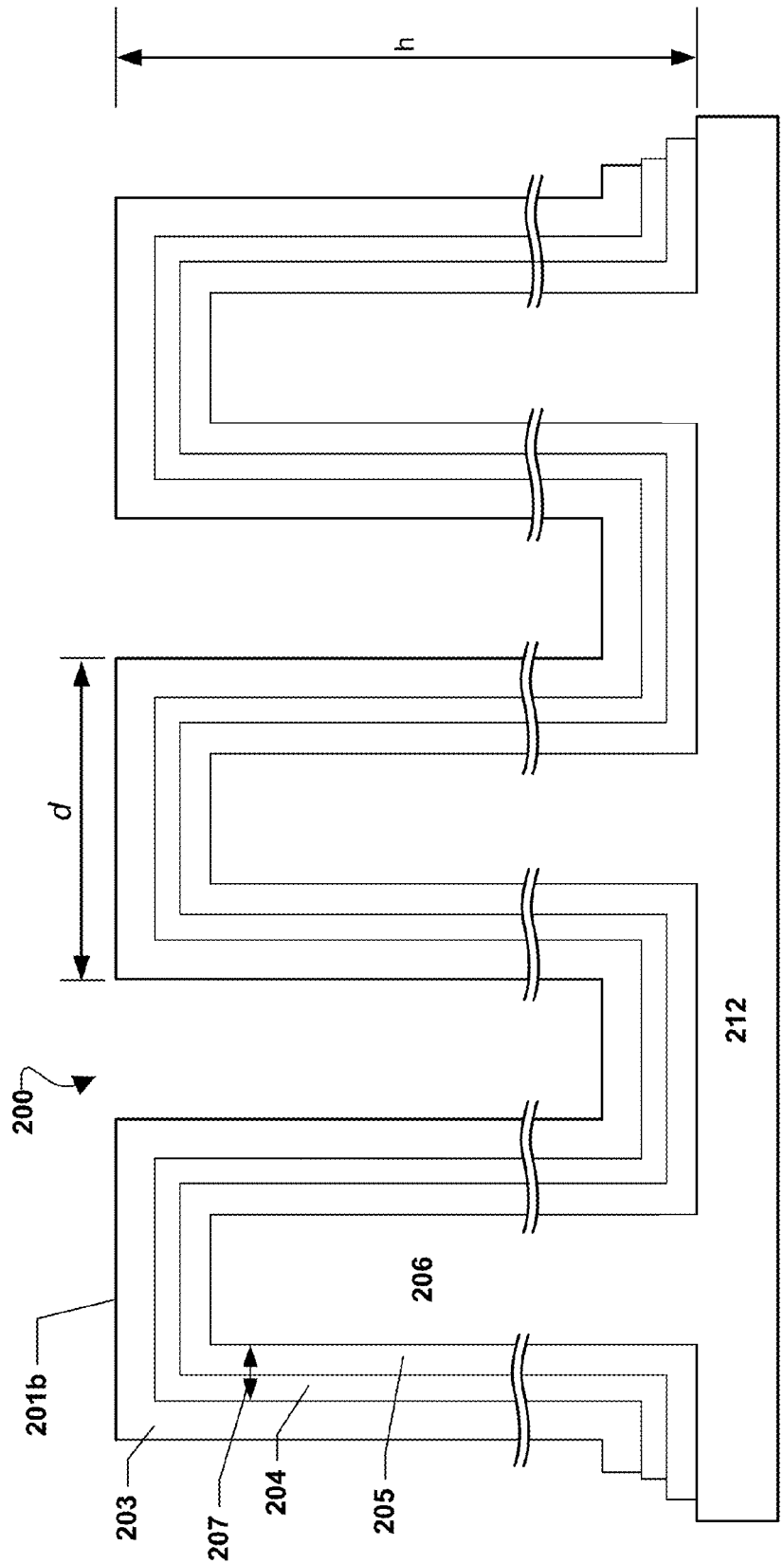
FIG. 2B is a cross-sectional side view of the photovoltaic bristles illustrated in FIG. 2A.

Further details of the structures making up photovoltaic bristles are illustrated in FIGS. 2A and 2B, which are cross-sectional views of a photovoltaic cell 200 made up of an array of photovoltaic bristles 201a, 201b, 201c, and 201d formed on a substrate 212. In general, photovoltaic bristles are generally cylindrical structures with generally cylindrical layers 203, 204 formed about a central core 206, with photovoltaically-active material layers 207 sandwiched between conducting materials at or on the core 206 and on the surface, which is a transparent conducting oxide layer 203. When photons interact with the photovoltaically-active layers 207 electron-hole pairs are generated, which are conducted out of the photovoltaic bristles by the conductive layers 206, 207 to conductive the players (replace with "layers") on the substrate 212.

The core 206 may be characterized by a core radius ($r_c$) that may be measured radially from the center of the photovoltaic bristle 201b to the inner surface of the absorption layer. The core 206 may be made of a variety of conductive materials and non-conductive materials. In an embodiment, the core 206 of a photovoltaic bristle may be a solid conductive core such as metal. For example, the core of the photovoltaic bristle may be gold, copper, nickel, molybdenum, iron, aluminum, doped silicon, and silver. In other embodiments, the core of a photovoltaic bristle may made from a non-conductive center, such as a semiconductor or polymer plastic, that is coated or covered with a conductive layer, such as gold, copper, nickel, molybdenum, iron, aluminum, doped silicon, or silver. In an embodiment, the core 206 may also include a coating to strengthen the microstructure 201b. In a further embodiment, the core of the photovoltaic bristles may be made from a doped semiconductor material, such as p-type amorphous silicon or n-type amorphous silicon. In another embodiment, the core 206 may be made from a different material than the substrate 212. In an embodiment, the core 206 may be made from the same material as the substrate 212.

The photovoltaic bristle includes an absorption layer 207 made up of one or more sublayers 204, 205 of photovoltaically-active materials that are configured to generate electron-hole pairs when a photon is absorbed. In an embodiment, the absorption layer 207 may include a p-type semiconductor sublayer (204 or 205) and an n-type semiconductor sublayer (205 or 204) forming a p-n junction within the absorption layer 207. For example, the p-type and the n-type semiconductor sublayers may be appropriately doped amorphous silicon. In another embodiment, the absorption layer 207 may include a p-type semiconductor sublayer, an intrinsic semiconductor sublayer, and an n-type semiconductor sublayer. For example, the p-type semiconductor, the intrinsic semiconductor, and the n-type semiconductor sublayers may be amorphous silicon. In a further embodiment, the absorption layer 207 of a photovoltaic bristle may be a single doped semiconductor sublayer forming a p-n junction with the core 206 that is doped to be either a p- or n-semiconductor. For example, in this embodiment the core 206 may be a p-type semiconductor and the absorption layer 207 may an n-type semiconductor layer.

As mentioned above, embodiment photovoltaic cells may be configured with bristle-packing densities defined according to the materials and dimensions of the photovoltaic bristles. As mentioned above, photovoltaic bristles 201a-201d have a radius r measured from the center of the photovoltaic bristle to the outer perimeter of the photovoltaic bristle. For purposes of calculating the bristle packing density, the mean radius $r_m$ of the bristles may be used since the individual radii may vary due to the variability of manufacturing techniques.

Each photovoltaic bristle 201a-201d is made up of a core 206 that is conductive or has a conductive outer surface, absorption layer 207, and an outer conductive layer 203, which will typically be transparent conductive layer such as a transparent conductive oxide or transparent conductive nitride. Due to the cylindrical form of photovoltaic bristles, the absorption layer 207 surrounds the core 206, and the outer conductive layer 203 surrounds the absorption layer 207. The absorption layer 207 as radial thickness ($d_{abs}$) that may be measured radially from the outer surface of the core 206 to the inner surface of the outer conductive layer 203. The absorption layer 207 may include a number of absorber sublayers or regions of photovoltaicly-active materials or combinations of photovoltaic materials. For example, the absorption layer 207 may include multiple absorber sublayers or regions that form a p-n junction, a p-i-n junction, or multi-junction regions, which have a generally circular cross-section as illustrated in FIG. 2A. The absorber sublayers or regions 204, 302, 205 may be made from one or more of silicon, amorphous silicon, polycrystalline silicon, single crystal silicon, cadmium telluride, gallium arsenide, aluminum gallium arsenide, cadmium sulfide, copper indium selenide, and copper indium gallium selenide.

The relative radial positions of the p-type, intrinsic, or n-type sublayers/regions may vary in the embodiments. For example, in one embodiment the p-type semiconductor material may be positioned radially inside the n-type semiconductor material. In another embodiment, the n-type semiconductor material may be positioned radially inside the p-type semiconductor material. In addition, multiple materials may be used to create a sequence of p-n and/or n-p junctions, or p-i-n junctions in the absorption layer. For example, the absorption layer may include an absorber sublayer of p-type cadmium telluride (CdTe) and an absorber sublayer of n-type cadmium sulfide (CdS). In an embodiment, the absorption layer 207 may be fully depleted. For example, the p-type region and the n-type region forming the sublayer or region 204 and the sublayer or region 205 may be fully depleted.

In an example embodiment, the absorption layer 207 may include a p-type semiconductor sublayer 205, such as p-type cadmium telluride, and an n-type semiconductor sublayer of a different material, such as n-type-cadmium sulfide. In another example embodiment, one sublayer 204 may be a p-type region, such as p-type amorphous silicon, and another sublayer 205 may be an n-type region of the same material as the sublayer 204 but doped to form an n-type semiconductor, such as n-type amorphous silicon.

For purposes of illustration, the absorption layer 207 radial thickness ($d_{abs}$) may encompass all the absorber sublayers or regions. In various embodiments, the absorption layer 207 thickness ($d_{abs}$) may be less than 0.01 microns, approximately 0.01 microns, or greater than 0.01 microns. Embodiment absorber thickness ($d_{abs}$) ranges include 0.01 to 0.10 microns, 0.10 to 0.20 microns, 0.20 to 0.30 microns, 0.30 to 0.40 microns, 0.40 to 0.50 microns, 0.50 to 0.60 microns, 0.60 to 0.70 microns, 0.70 to 0.80 microns, 0.80 to 0.90 microns, 0.90 to 1.0 microns, 0.01 to 1.0 microns, and more than 1.0 microns. In an example embodiment, the absorption layer 207 thickness ($d_{abs}$) may be approximately 0.64 microns subject to variability in the manufacturing process by which the absorption layers are applied to the core 206.

The outer conductive layer 203 has a radial thickness ($d_{ocl}$) which may be measured radially from the outer surface of the absorption layer 207 to the outer surface of the outer conductive layer 203 (i.e., the outer surface of the photovoltaic bristle). In an embodiment, the outer conductive layer 203 is a transparent conductive oxide ("TCO"), such as a metal oxide. In an embodiment, the outer conductive layer 203 may include a dopant creating a p-type or n-type transparent conductive oxide. For example, the transparent conductive oxide layer 203 may be one of intrinsic zinc oxide, indium tin oxide, and cadmium tin oxide ($Cd_2SnO_4$). In an embodiment, the outer conductive layer 203 may include a transparent conductive nitride such as titanium nitride (TiN). In another embodiment, the outer conductive layer 203 may include a buffer with or without the dopant. Some examples of an outer conductive layer 203, which may be a transparent conductive oxide with a dopant, include boron doped zinc oxide, fluorine doped zinc oxide, gallium doped zinc oxide, and aluminum doped zinc oxide. Some examples of buffers that may be added to a transparent conductive oxide include zinc stannate ($Zn_2SnO_4$), titanium dioxide ($TiO_2$), and similar materials well known in the art.

As shown and described later with FIGS. 10A-10D, the outer conductive layer 203 may include a number of multiple conductive and/or non-conductive sublayers to allow a photovoltaic bristle to meet the required design optical thickness ($d_{ocl}$) while simultaneously benefiting from the field effects generated from a thin transparent conductive sublayer within the outer conductive layer 203. With multiple sublayers, the outer conductive layer 203 may also benefit from added flexibility to the photovoltaic bristles for a more resilient metamaterial device. As an example, a bi-layer outer conductive layer 203 may include a conductive sublayer such TCO and a non-conductive sublayer such as an optically transparent polymer.

As shown in FIG. 2B, the photovoltaic bristles extend from a substrate 212 of the photovoltaic cell 200. The substrate 212 may be any suitable substrate material known in the art. For example, the substrate 212 may be glass, doped semiconductor, diamond, metal, a polymer, ceramics, or a variety of composite materials. The material used in the substrate 212 may be a material used elsewhere in the photovoltaic cell 200, such as a material used in any layer of a photovoltaic bristle 201a-201d. Alternatively, the material used in the substrate 212 may be different from the materials in the photovoltaic bristles 201a-201d. In an embodiment, the core 206 and the substrate 212 may be made from the same base material that is covered by a conductive material. For example, the substrate 212 and the cores 206 may be made from glass, semiconductor material, a polymer, ceramics, or composites. In a further embodiment, the core 206 and substrate 212 may include similar materials, while the core 206 is made from additional materials, such as gold, copper, nickel, molybdenum, iron, aluminum, or silver.

Figure 2C:
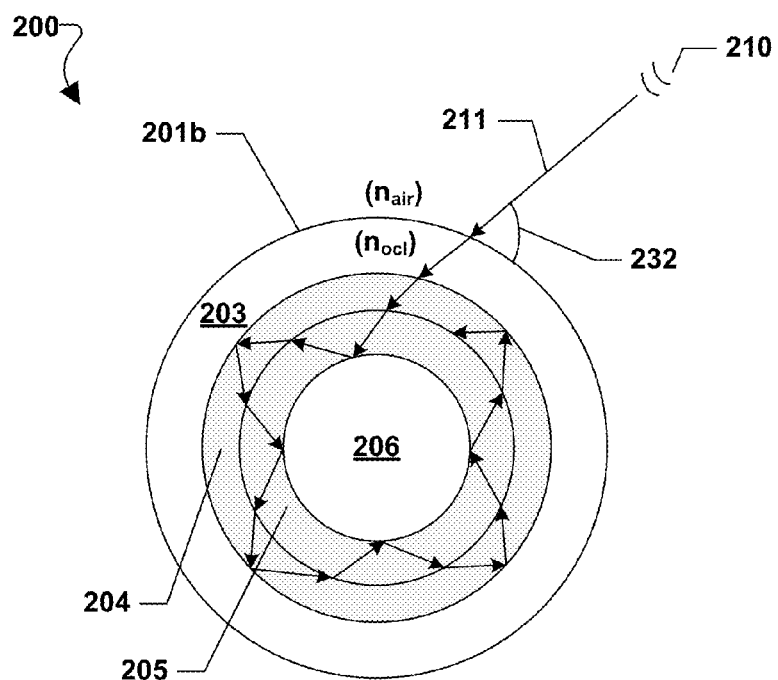
FIG. 2C is a cross-sectional top view of one of the photovoltaic bristles illustrated in FIG. 2A.
Figure 2D:
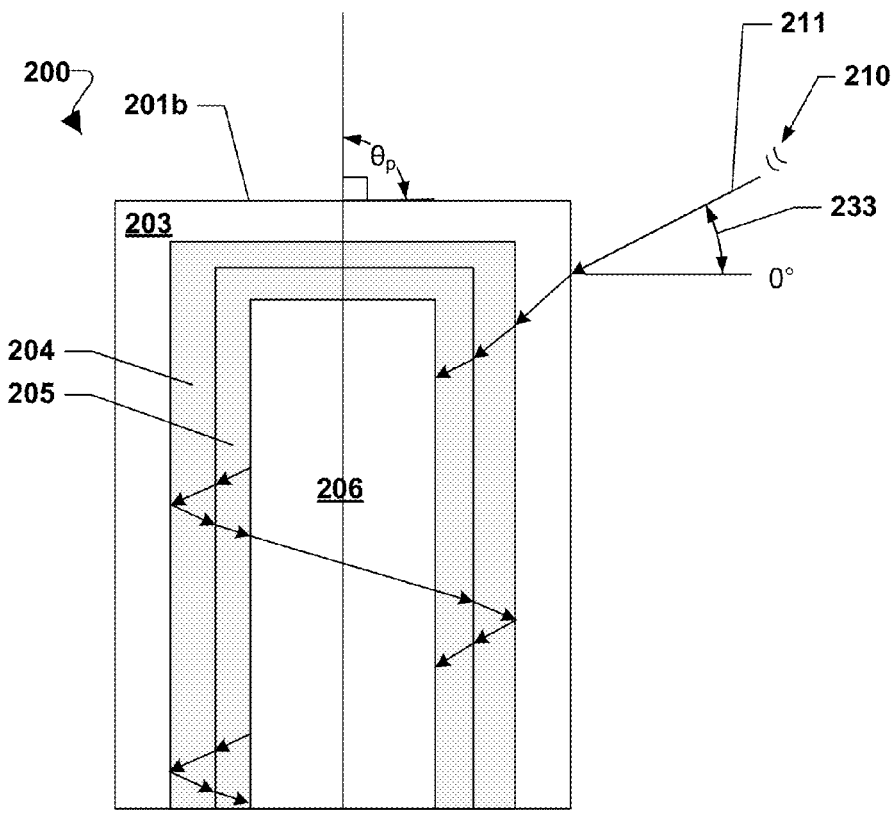
FIG. 2D is a cross-sectional side view of one of the photovoltaic bristles illustrated in FIG. 2A.

In the various embodiments, the index of refraction of the outer conductive layer 203 and absorption layer 207 and sublayers 204, 205 as well as the thicknesses of these layers may be configured to increase the probability of absorption of incident photons and internal refraction of absorbed photons as illustrated in FIGS. 2C and 2D. As illustrated in FIG. 2C, photovoltaic bristles 201 designed and formed in accordance with the embodiment designs described below, may guide an absorbed photon 210 so that it follows an internal path 211 that exhibits a high probability that the photon remains within the photovoltaic bristle 201 due to total internal reflection. As illustrated, by adjusting the index of refraction and thickness of each layer 203, 204, 205, a photon may be caused to refract inwardly until it contacts the conductive core 206 where it may be spectrally reflected. It should be noted that the embodiment illustrated in FIGS. 2A-D features and inner reflector due to the metal core 206. In other embodiments described herein, a refraction layer may be applied over the court (core) 206 to achieve the same photon reflection effects. In such an embodiment a reflective layer they (may) be formed over the conductive core and under the absorber layer, such as a semiconductor or dielectric material layer having a lower index of refraction than the absorber layer. This refraction layer may be configured to reflect the photon at the interface between the reflection layer and the absorber layer, and not rely on reflection off of the conductive core 206. For example, such as diffraction layer may be formed from an aluminum doped zinc oxide layer of about 500-1500 angstroms and (in) thickness. Reflected photons then refract through each layer 204, 205 until they reach the outer conductive layer 203, where the difference in the index of refraction between the absorption sublayer 205 and the outer conductive layer 203 causes the photons to reflect back into the absorption layers of the photovoltaic bristle. Those reflected photons that are not reflected inwardly at the boundary between the outer conductive layer 203 and the absorption sublayer 205 may pass through the outer conductive layer 203 and be reflected off of the interface between the outer conductive layer 203 and air due to the difference in the index of refraction at this interface. In either manner, photons may remain within the photovoltaic bristle passing back and forth through the absorption layer 207 until they are eventually absorbed or exit the bristle.

FIG. 2D illustrates the photon traveling within and around the photovoltaic bristle 201. Since the photovoltaic bristle 201 extends a distance h above the substrate, a photon 210 entering the bristle at an angle may travel along the axial length or height of the photovoltaic bristle 201.

FIG. 2D also illustrates that photons striking the photovoltaic bristle 201 will have a higher probability of absorption when they strike the sidewall of a photovoltaic bristle at a compound angle that is less than 90 degrees but more the 0 degrees to the surface, where an angle perpendicular to the sidewall surface is considered to be 0 degrees. The compound incident angle includes a vertical plane component 233 (shown in FIG. 2D) and a horizontal plane component 232 (shown in FIG. 2C). The horizontal plane component 232 is defined by a photon 210 striking the outer surface of the bristle at a point along the perimeter of the circular cross-section plane forming an angle with the perimeter where an angle perpendicular to the perimeter is considered 0 degrees. Similarly, the vertical plane component 233 is defined by the photon 210 striking the outer surface of the bristle at a point along the height forming a vertical angle with the surface where an angle perpendicular to the surface is considered 0 degrees. Analysis of photon absorption characteristics of the outer conductive layer revealed that photons striking the surface of the sidewall of the photovoltaic bristle at normal in the horizontal component 232 and the vertical component 233 may result in a compound angle of 0 degrees and a high probability of being reflected off the surface. Similarly, photons striking the surface of the sidewall of the photovoltaic bristle parallel to the vertical and the horizontal component will also have a high probability of being reflected off the surface. However, photons striking the side surface at a compound angle between 10° and 80° have a high probability of being absorbed into the outer conductive layer 203. Once absorbed, the internal refraction characteristics of the absorption layers 204, 205 and outer conductive layer 203 cause the photons to remain within the photovoltaic bristle 201 for an extended time or path length. This characteristic is very different from conventional photovoltaic cells, which exhibit the maximum power conversion efficiency when the angle of incidence of photons is normal to its single planar surface.

The difference between the incident angle corresponding to conventional photovoltaic cells and the photovoltaic bristles is illustrated by angle $\theta_p$ in FIG. 2D. The preferred incident angle for a traditional solar cell, $\theta_p$, would form a right angle with the top of the bristle as well as the substrate of the full metamaterial device (not shown). Thus, not only does the photovoltaic bristle exhibit better absorption characteristics at off-angles (not perpendicular or parallel to the surface), the reference point for measuring an off-angle is vastly different from a conventional photovoltaic cell. For a metamaterial device with photovoltaic bristles, the reference point is measured from the sidewall of a bristle in two planes, which is unachievable by a planar photovoltaic cell. Thus, due to the off-angle absorption characteristics of photovoltaic bristles, the embodiment photovoltaic cells exhibit significant power conversion efficiency across a broad range of angle of incidence. This translates to more power generation throughout the day than achievable from fixed solar panels with conventional planar solar arrays that produce their peak efficiencies (i.e., maximum power generation) when the sun is directly overhead.

Although conventional planar solar arrays may have high peak efficiency, as described above, peak efficiencies are only a single point in time. Typically conventional planar photovoltaic cells show a significant drop in efficiency and power generation in the morning and the afternoon (i.e., not solar noon). Due to the drop in efficiency, the conventional photovoltaic cells have a low total efficiency (or average efficiency)

when measured over an entire day leading to a low total power generation. However, the embodiment metamaterials with photovoltaic bristles have sustained high efficiency throughout the day because the compound angle of incidence for the metamaterial more closely mirrors that of sun's presentation of photons. Thus, photons are more likely to strike the sidewalls of the photovoltaic bristles 201 with a compound angle of incidence between approximately 10 and 80 degrees resulting in sustained high absorption efficiency and a high total power generation.

Figure 2E:
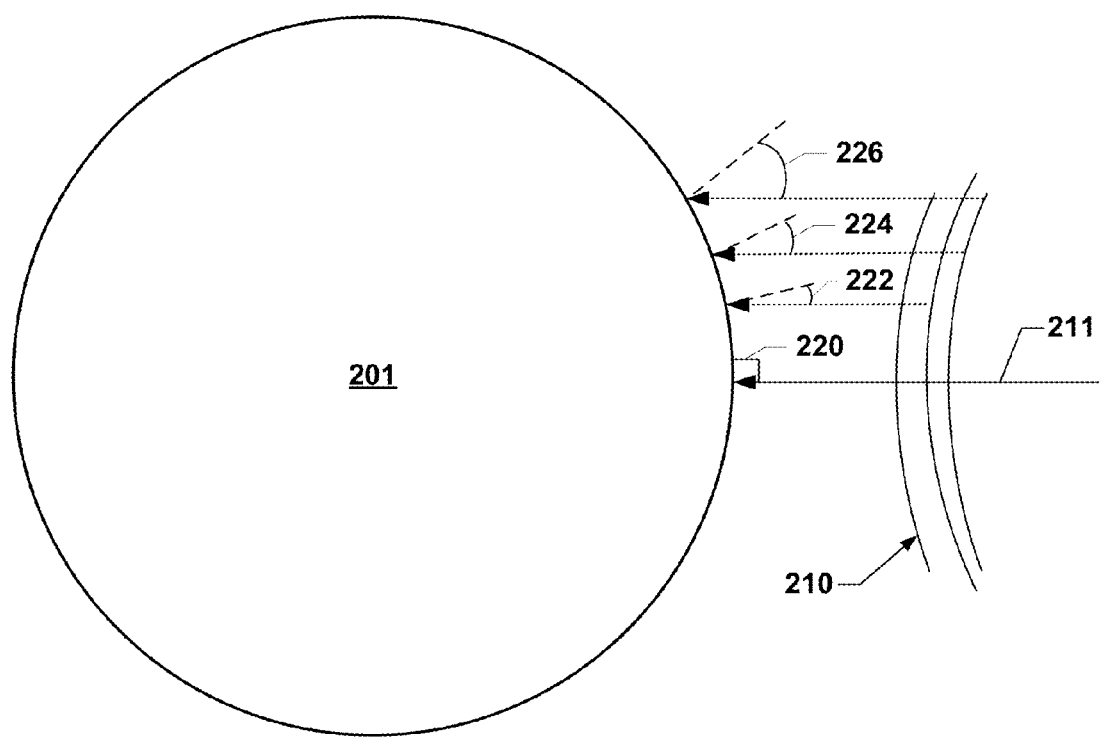
FIG. 2E is a diagram illustrating off angle elements of a photon wave interacting with a circular cross-section photovoltaic bristle.

While photovoltaic bristles absorb photons more readily when they strike the surface at an angle, the probability of photon absorption is not a strong function of angle of incidence. This is due to the small diameter and circular cross-section of photovoltaic bristles and the wave nature of photons. As illustrated in FIG. 2E, even a photon 210 striking the surface of a photovoltaic bristle 201 at a right angle 220 to the surface will interact with the surface at smaller angles of incidence due to the wave nature of the photon. As illustrated, a photon 210 has a wave function that extends beyond its line of travel 211 such that there is a probability of the photon interacting with the surface of the photovoltaic bristle 201 some distance from the intersection of the line of travel. Due to the small diameter and circular nature of the bristle, there is a finite probability that the photon will interact with the surface at a smaller angle 222 on either side of the line of travel 211. It is also a finite probability that the photon will interact with the surface at even smaller angles 224, 226 a further distance from the line of travel 211. Thus, even a photon that might be expected to be reflected from a photovoltaic bristle has a significant probability of being absorbed due to the interaction of the photon wave with the curved surface of the bristle.

As described above, the materials and thicknesses forming the outer conductive layer and absorption layers of the photovoltaic bristle may be selected to result in a high probability of photon internal refraction to increase the probability of photon absorption. This may include selecting materials so that the index of refraction of outer transparent conducting oxide layer ($n_{ocl}$) is lower than the index of refraction of the inner absorption layers. For, example the index of refraction of the outer conductive layer may be lower than the index of refraction of the absorption layer. In addition, the index of refraction of outer transparent conducting oxide layer ($n_{ocl}$) will be greater than the index of refraction of air ($n_{air}$). Thus, the materials of materials and thicknesses forming the outer conductive layer and absorption layers may be selected so that each layer moving inward has a higher index of refraction than the preceding outer layer and all layers may have greater indexes of refraction than air.

By radially ordering the materials by indexes of refractions from a low index of refraction on the outside to a higher index of refraction in each inner layer, the photovoltaic bristle 201 may refract or guide photons 210 towards the core 206 of the photovoltaic bristle 201. Since the core 206 is highly conductive, it is also highly reflective, so that it will reflect photons 210. Due to the large difference in index of refraction between the absorber layer and the outer conductive layer 203, photons striking this boundary at an angle will be refracted inwardly. As a result of these reflections and refractions, photons 210 may be effectively trapped within the absorption layer 207 for a longer period of time, thereby increasing the probability of interaction with the absorption layer 207 causing an electron-hole pair to be formed. Increasing the probability of photon absorption may result in more electrical current being generated for the same amount of incident light energy by the embodiment photovoltaic cells than is achievable by conventional photovoltaic cells.

In an embodiment mentioned above, and (an) inner refraction or reflection layer may be added on top of the core 206 in order to provide an inner reflection interface for photons. In this embodiment, a layer of semi-conductive or insulator material, such as Al:ZnO, ZnO, or ITO, they (may) be applied over the metal core. This layer may be at least one-half wavelength inch (in) thickness, depending on the refractive index of the material. For example, such a layer made of Al:ZnO (AZO) may be approximately 1500 angstroms thick over which the absorber layer may be apply (remove "apply") applied. Such an AZO layer has a refractive index that is lower than the absorber layer. This difference in refractive index coupled with the curvature of the interface of these 2 layers will reflect the photons before they reach the metal core. The reflection induced by this design may exhibit lower losses than then designs in which photons reflect from a metal surface of the core. This additional refraction layer over the core may be included in the equations for determining the photovoltaic bristle diameter as a contributor to the $r_c$ value. In other words, including a 1500 angstrom AZO layer over a 0.75 micron radius core would result in a corner (core) diameter $r_c$ for purposes of the design equations of 0.9 microns. The use of such a refraction layer may be included in any of the embodiments illustrated and described herein. For example, in the embodiments in which the center of the court (core) is a plastic rod, a metal layer is applied over the plastic core and then the AZO is applied over the metal layer. In further embodiments, this refractive layer forming a reflecting interface may be formed using multiple layers, such as: ITO-AZO; ITO-AZO-ITO; TiO2-TiN—TiO2; ZnO-AZO-ZnO; etc. Such multiple layer may function similar to a Bragg reflector used in fiber optics.

The higher energy conversion efficiency enabled by photovoltaic bristles of the various embodiments may be achieved by designing the bristles with outer conductive layer and absorption layer materials and thicknesses, with the bristles spaced apart at a packing density that optimize or nearly optimize the performance enhancement characteristics described above. This may be achieved by designing the photovoltaic bristles and arranging the arrays of the bristles using the following design techniques.

In an embodiment, the outer conductive layer and absorption layer materials and thicknesses of photovoltaic bristles may be selected in set according to equation 1:

$$\frac{n_{ocl} * r_c}{n_{air} * (r_c + d_{abs} + d_{ocl})} \leq 1 \qquad \text{Eq. 1}$$

where:
$r_c$ is the bristle core radius;
$n_{air}$ is the index of refraction for air;
$n_{ocl}$ is the index of refraction of the outer conductive layer;
$d_{ocl}$ is the thickness of the outer conductive layer; and
$d_{abs}$ is the thickness of the absorption layer.

The median radius of a photovoltaic bristle ($r_m$) is set according to equation 2:

$$r_m = r_c + d_{abs} + d_{ocl} \qquad \text{Eq. 2}$$

where:
$r_m$ is the median radius of the photovoltaic bristles. Thus, the median radius of a photovoltaic bristle ($r_m$) is the sum of the bristle's core radius ($r_c$) and the thicknesses of the absorption layer ($d_{abs}$) and outer conductive layer ($d_{ocl}$).

Combining equation 1 and equation 2 and solving for the median radius of the photovoltaic bristles ($r_m$) yields equation 3:

$$r_m \geq \frac{n_{ocl} * (d_{abs} + d_{ocl})}{(n_{ocl} - n_{air})} \qquad \text{Eq. 3}$$

Thus, the radius ($r_m$) of the photovoltaic bristles may depend upon the first radial thickness ($d_{abs}$), the second radial thickness ($d_{ocl}$), the index of refraction of the outer conductive layer ($n_{ocl}$), and the index of refraction of air ($n_{air}$). In other words, a photovoltaic bristle with a ratio as defined in equation 3 will exhibit a high probability of photon internal refraction, and thus exhibit a higher probability of photon absorption and electron-hole generation Equation 3 may also be used to calculate the appropriate thicknesses for the outer conductive layer and absorption layer, since these two layer thicknesses are related in the equation. In order to increase the amount of photovoltaic material, the absorption layer thickness ($d_{abs}$) may be set to be greater than the outer conducting layer radial thickness ($d_{ocl}$). However, the outer conductive layer will need to have a minimum thickness in order to maintain desirable conductivity. Thus, there will be a design balance between the two layer thicknesses. In an embodiment, the transparent conducting oxide layer thickness ($d_{ocl}$) may be about two thirds (i.e., approximately sixty-seven percent) of the absorption layer thickness ($d_{abs}$). Thus, in this embodiment, the outer conductive layer thickness ($d_{ocl}$) may be determined by equation 4:

$$d_{ocl} = 0.67 * d_{abs} \qquad \text{Eq. 4}$$

For example, with an absorption layer thickness $d_{abs}$ of approximately 0.64 microns, the outer conductive layer thickness, $d_{ocl}$, would be approximately 0.43 microns. Although the outer conductive layer may be determined by equation 4, the actual thickness of the outer conductive layer may deviate from this relationship. The actual thickness of the outer conductive layer may be thicker, but thicker outer conductive layers may result in a higher probability that photons will graze off the outer conductive layer instead entering the absorption layer. Thus, equation 4 is merely an exemplary relationship between the thicknesses of outer conductive layer and the absorption layer.

It is worth noting that the radius of the bristle $r_m$ as defined by equation 2 is important for considerations of inter-bristle spacing in order to address shading issues since thicker bristles cast wider shadows. The core radius $r_c$ is also a key consideration, particularly for manufacturability and for structural rigidity considerations. While tall thin bristles may be desirable for energy conversion efficiency reasons, there is likely to be a minimum core radius below which photovoltaic bristles cannot be affordably manufactured. Thus, the bristle core radius $r_c$ parameter may be determined based upon the type of manufacturing process used to create them. The bristle core radius $r_c$ parameter may also be determined based upon the strength properties of the material used to form the cores. Stronger materials may enable the bristles to be made smaller in diameter (i.e., with a smaller core radius $r_c$). On the other hand, weaker materials that may enable lower cost or higher product rates may require the bristles to be made larger in diameter (i.e., with a larger core radius $r_c$).

As mentioned above, a photovoltaic cell 200 including an array of photovoltaic bristles may be designed to achieve high power generation efficiency by reducing the shading of neighboring bristles in the array. The shading caused by neighboring bristles may be reduced by controlling the minimum edge-to-edge spacing ($SP_{EtoE}$) and maximum edge-to-edge spacing ($LP_{EtoE}$) between photovoltaic bristles. In an embodiment, the minimum edge-to-edge spacing ($S_{PEtoE}$) may be calculated using equation 5:

$$SP_{EtoE} = ((1.67 * d_{abs}) + r_c) * (2) * (0.9) \qquad \text{Eq. 5}$$

where ($r_c$) is the core radius (e.g., radius of core 206 of photovoltaic bristle 201b as illustrated in FIG. 2A), and ($d_{abs}$) is the thickness of the absorption layer (e.g., thickness of the absorption layer 207). For example, for a bristle having an absorption layer thickness ($d_{abs}$) of 0.64 microns and a core radius ($r_c$) of 0.75 microns, the minimum edge-to-edge spacing ($SP_{EtoE}$) would be approximately 3.27 microns. In this embodiment, the array of photovoltaic bristles may be formed so that no two neighboring bristles in the array are closer than approximately 3.27 microns.

The maximum edge-to-edge spacing ($LP_{EtoE}$) between photovoltaic bristles may be calculated using equation 6:

$$LP_{EtoE} = ((1.67 * d_{abs}) + r_c) * (2) * (1.1) \qquad \text{Eq. 6}$$

For example, for photovoltaic bristles having an absorption layer thickness ($d_{abs}$) of 0.64 microns and a core radius ($r_c$) of 0.75 microns, the maximum edge-to-edge spacing ($LP_{EtoE}$) would be approximately 4.0 microns. In this embodiment, the array of photovoltaic bristles may be formed so that no two neighboring bristles in the array are separated by more than 4.0 microns. Although the maximum spacing is given by the example equation 6, bristles may have a larger edge-to-edge spacing than the limits of the equation. However, increasing the edge-to-edge spacing beyond the maximum provided in equation 6 may result in less power generation, due to the lower number of bristles in the metamaterial device.

Equations 4 and 5 may be combined to define the overall edge spacing of neighboring photovoltaic bristles to define the range of edge-to-edge spacing ($P_{EToE}$) for neighboring photovoltaic bristles as shown in equation 7:

$$((1.67 * d_{abs}) + r_c) * (2) * (0.9) \leq P_{EtoE} \leq ((1.67 * d_{abs}) + r_c) * (2) * (1.1) \qquad \text{Eq. 7}$$

As an example, photovoltaic bristles with an absorption layer thickness ($d_{abs}$) of 0.35 microns and a core radius ($r_c$) of 0.6 microns would be arranged with a minimum edge-to-edge spacing ($SP_{EtoE}$) of approximately 2.13 microns and a maximum edge-to-edge spacing ($LP_{EtoE}$) of approximately 2.61 microns. Designing photovoltaic bristles according to equation 1 and designing the array spacing of photovoltaic bristles according to equation 7 may result in a metamaterial device according to the various embodiments that exhibits significantly higher energy conversion efficiencies than is achievable with conventional photovoltaic panels.

It is worth noting that the arrays of bristles within the metamaterial may be ordered or non-ordered. An ordered array of bristles may have a defined geometric pattern as limited by the trigonomic values such as the short edge-to-edge and long edge-to-edge spacing provided in equation 7. However, the ordered arrays may include a hexagonal pattern instead of a strict trigonomic pattern meaning that the maximum edge-to-edge spacing of a neighboring bristle neighbor spacing may be greater than that listed in equation 6. The ordered array of bristles may also include a diamond pattern, a rectangular pattern, a pentagon, octagon or any other geometric pattern. In an embodiment, the arrays of bristles may be a non-ordered pattern. The non-ordered pattern of bristles may be created similar to the ordered-pattern, such as a trigonomic pattern as described in the equations above, but also including a break in the pattern. For example, the bristles may have a standard trigonomic pattern, but every fifth bristle in a row is removed. Alternatively, the metamaterial may include any non-standard geometric pattern for the bristle arrangement such as a swirling arrangement of bristles.

The height of each photovoltaic bristle within the array of photovoltaic bristles may also affect the probability of photon absorption. In an embodiment, the height of a photovoltaic bristles may be greater than 0.1 microns and less than or equal to 100 microns. In an embodiment, the height of a photovoltaic bristle may be selected based on other characteristics of the array of photovoltaic bristles, including the core radius of each photovoltaic bristle and the spacing between photovoltaic bristles. In part, this selection of the bristle height is made based on the bristle diameter and separation distances to ensure that at least a portion of the bristle side wall is not shadowed by adjacent bristles. This design consideration is a matter of simple geometry once the bristle core radius and separation distances are selected. As described above, the bristle radius and spacing distances may be determined based upon material indices of refraction and thicknesses of the absorption layer and transparent conducting oxide layer, and the bristle core radius, each of which may be defined or selected based on the properties of the materials used for these parts of the photovoltaic bristle. Thus, bristle height may also be determined based on those properties and thicknesses. In short, the entire size and spacing of the photovoltaic bristles in an embodiment photovoltaic cell may be determined by the material properties of the bristle core, absorption layers and transparent conducting oxide.

The energy conversion efficiency embodiment photovoltaic cells made up of an array of photovoltaic bristles may be increased by designing the photovoltaic bristles with a minimum height ($h_{min}$) that is determined based on the bristle radius and separation distances using equation 7:

$$h_{min} = \frac{(((1.67 * d_{abs}) + r_c) * (2) * (0.9))}{\tan(40°)} \quad \text{Eq. 7}$$

where $r_c$ is the radius of the core, and $d_{abs}$ is the thickness of the absorption layer. For example, with a core radius ($r_c$) of 0.75 microns and an absorption layer thickness ($d_{abs}$) of 0.64 microns, and the minimum height for the microstructure may be 3.90 microns. In Eq. 7 the term $\tan(40°)$ is provided as a design guideline for most applications. However, this factor may be replaced with the tangent of any angle up to approximately 80 degrees. The result of increasing the angle would be taller bristles. The angle selected in this equation may be adjusted for integrated power gain optimization. This angle may also change depending on whether the photovoltaic cell will be used for tracking or non-tracking designs.

With the seven design formulas described above, a range of embodiment photovoltaic cell designs can be developed that exhibit the desirable energy conversion efficiency characteristics described above. For example, FIGS. 2A-2D illustrate an embodiment in which the absorption layer 207 is made up of to sublayers 204, 205, such as a p-type semiconductor layer and an n-type semiconductor layer to produce a PN junction absorption layer 207. The embodiment illustrated in FIGS. 2A-2D features a solid conductive core 206, such as a core made from a metal, metal alloy or conductive semiconductor as listed above. However, photovoltaic bristles may also be made with more sublayers, as well as non-conductive cores provided a conductive coating is applied to the core before photovoltaic material layers are applied. Other example embodiments of photovoltaic cell designs are described below with reference to FIGS. 3A-3D, 4A-4D, 5A-5D, 6A-6D, and 7A-7D.

FIGS. 3A, 3B, 3C, and 3D illustrate an embodiment photovoltaic cell 300 in which the absorption layer 207 in the photovoltaic bristles 201a-201d include three absorber sublayers or regions 204, 302, 205. In an embodiment, the absorption layer thickness (or a first radial thickness) ($d_{abs}$) is equal to the thicknesses of the three absorber sublayers or regions 204, 302, 205 combined. In an embodiment, the absorber sublayers 204, 302, 205 may be a n-type semiconductor material, an intrinsic semiconductor material, and a p-type semiconductor material, respectively. In an alternative embodiment, the absorber sublayers may be arranged in the reverse order, such that absorber sublayers 204, 302, 205 may be a p-type semiconductor material, an intrinsic semiconductor material, and a n-type semiconductor material. In another embodiment, the absorber sublayers 204, 302, 205 may be a p-type semiconductor, an n-type semiconductor, and a p-type semiconductor, respectively. In an embodiment, the absorber sublayers 204, 302, 205 may be a n-type semiconductor, a p-type semiconductor, and a n-type semiconductor, respectively. In an embodiment, the absorption layer may include multiple p-n or p-i-n junctions.

In various embodiments, the absorber sublayers or regions 204, 302, 205 may made from one or more of silicon, amorphous silicon, polycrystalline silicon, single crystal silicon, cadmium telluride, gallium arsenide, cadmium sulfide, copper indium selenide, and copper indium gallium selenide. In an embodiment, the semiconductor materials for each absorber sublayer 204, 302, 205 may be different semiconductor materials. In an embodiment, the semiconductor materials for each absorber sublayer 204, 302, 205 may be the same semiconductor material. For example, absorber regions 204, 302, 205 may include a n-type amorphous silicon, an intrinsic amorphous silicon, and a p-type amorphous silicon.

Figure 3A:
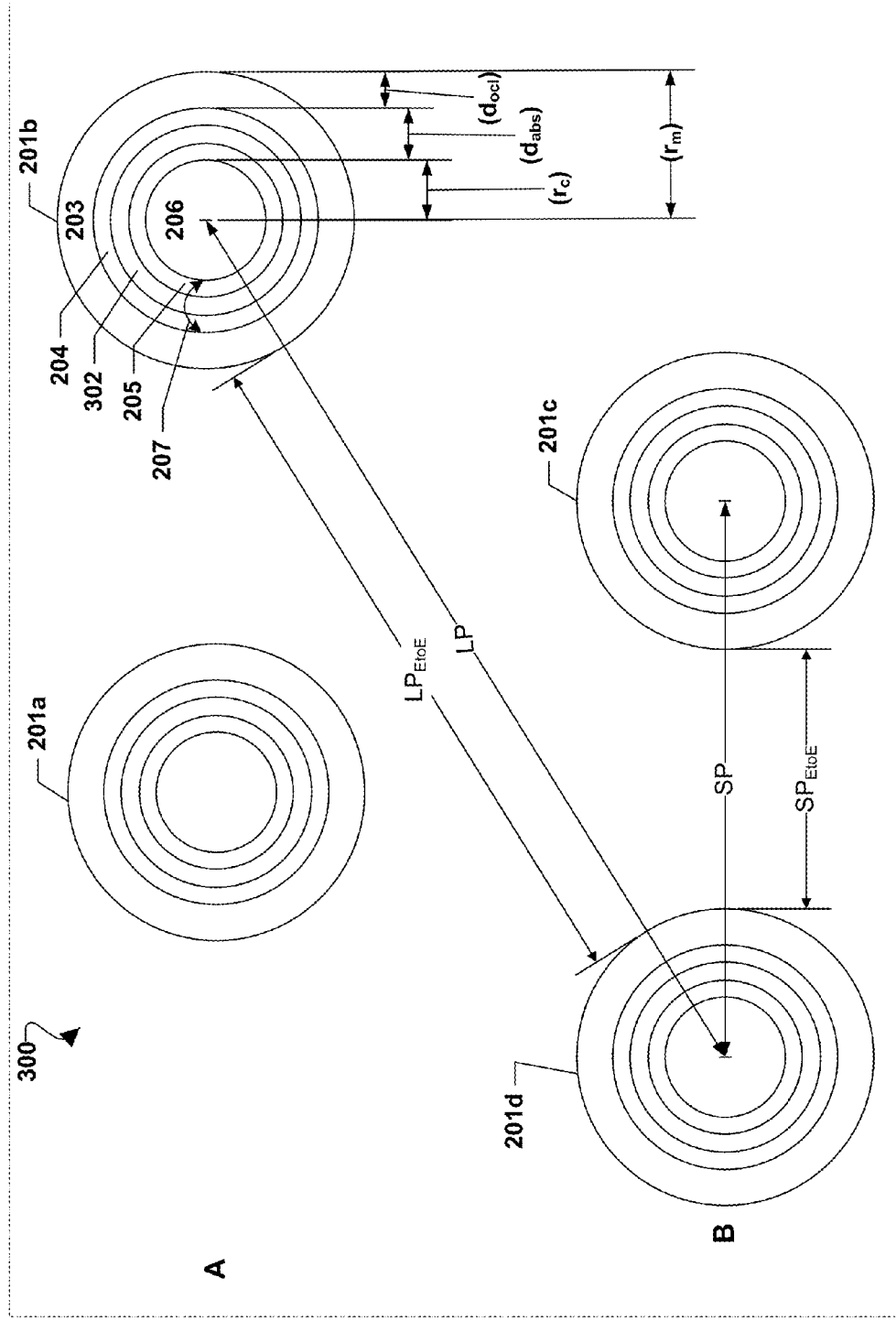
FIG. 3A is a cross-sectional top view of a section of an embodiment in which photovoltaic bristles have a conductive core and three absorber sublayers or regions.
Figure 3B:
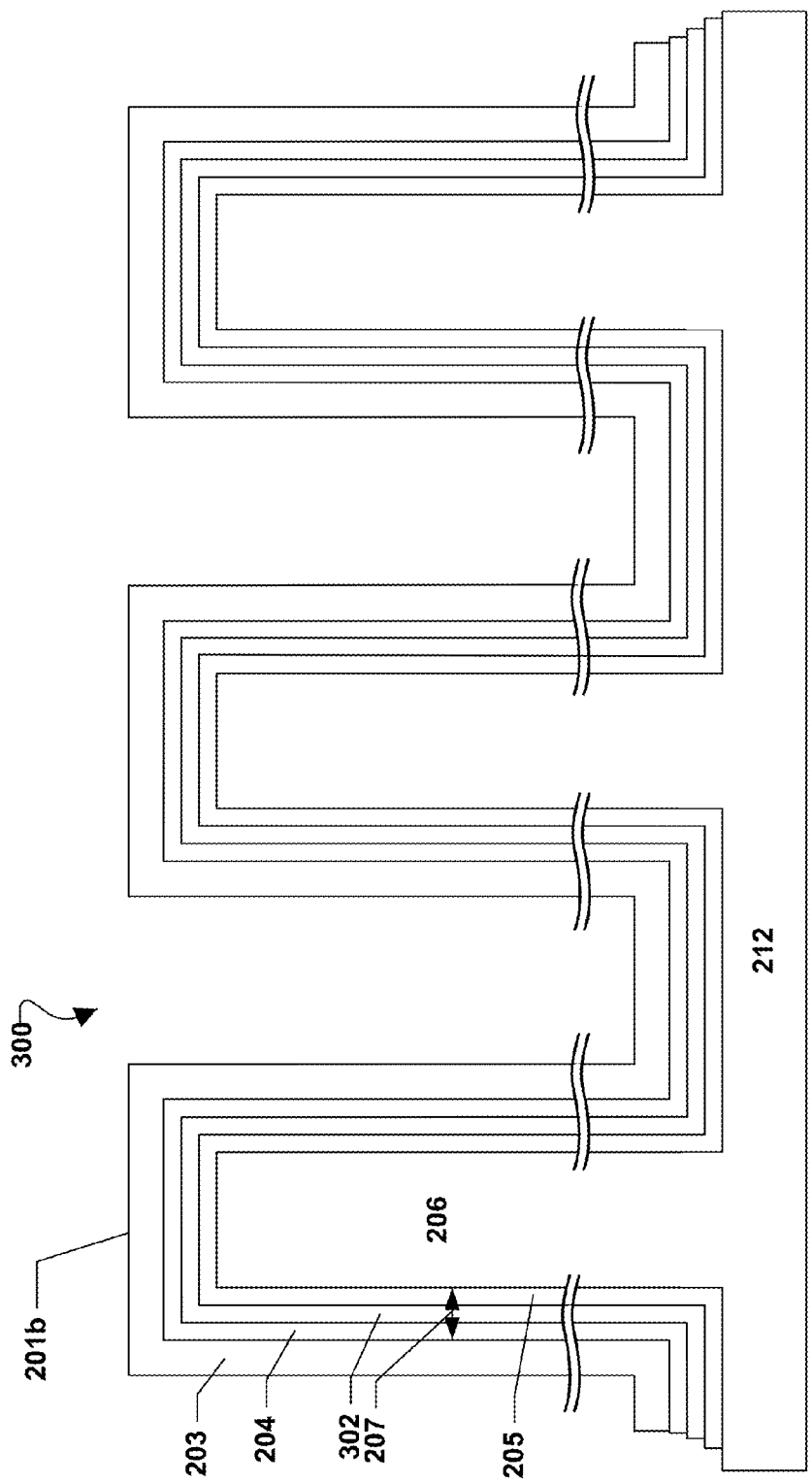
FIG. 3B is a cross-sectional side view of the photovoltaic bristles illustrated in FIG. 3A.
Figure 3C:
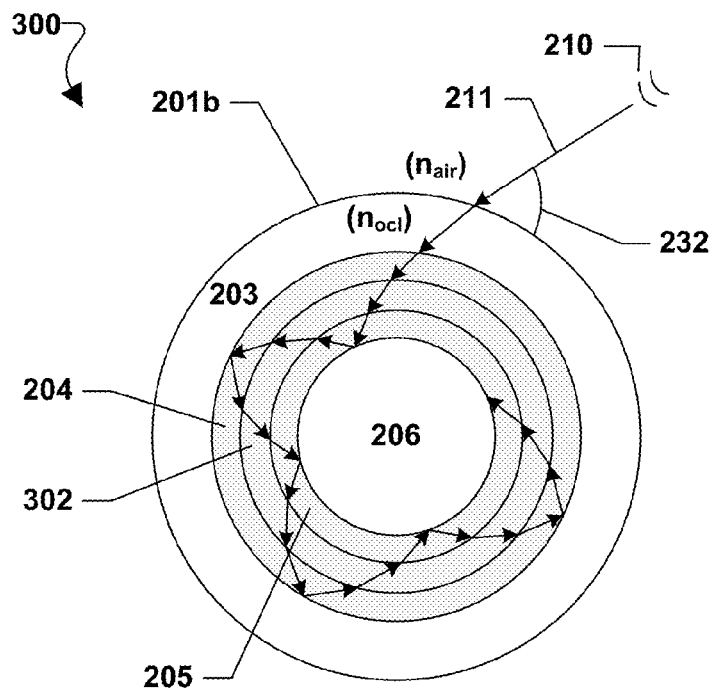
FIG. 3C is a cross-sectional top view of one of the photovoltaic bristles illustrated in FIG. 3A.
Figure 3D:
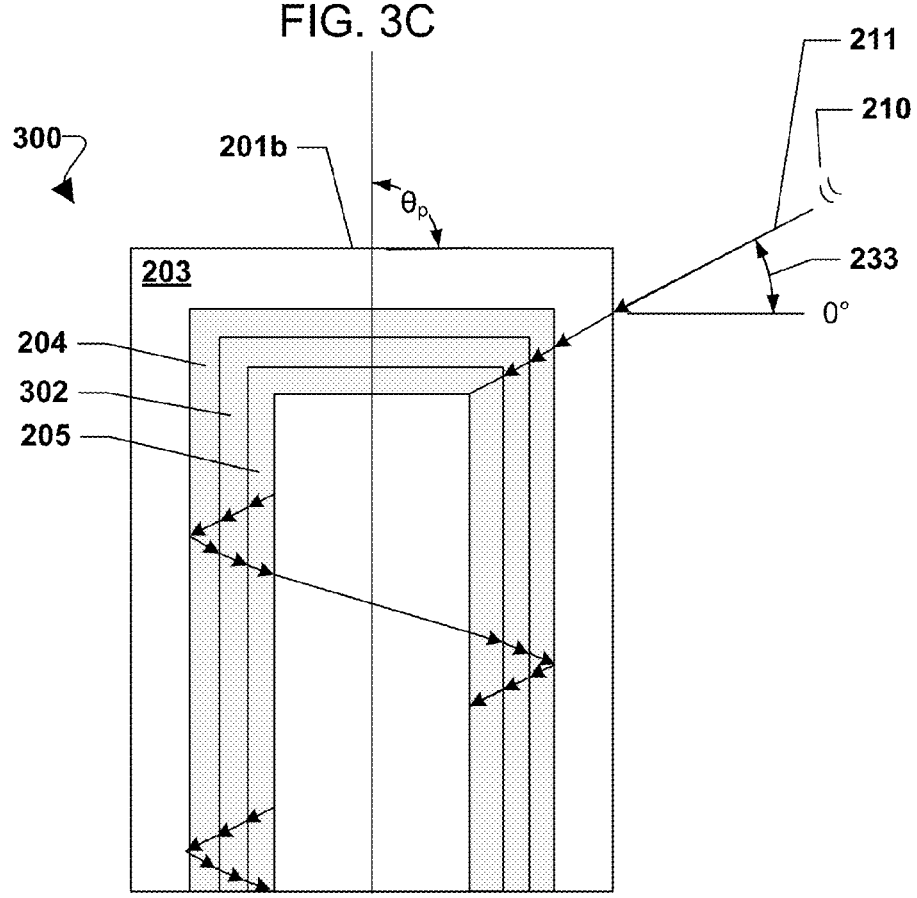
FIG. 3D is a cross-sectional side view of one photovoltaic bristle of the photovoltaic cell illustrated in FIG. 3A.
Figure 4A:
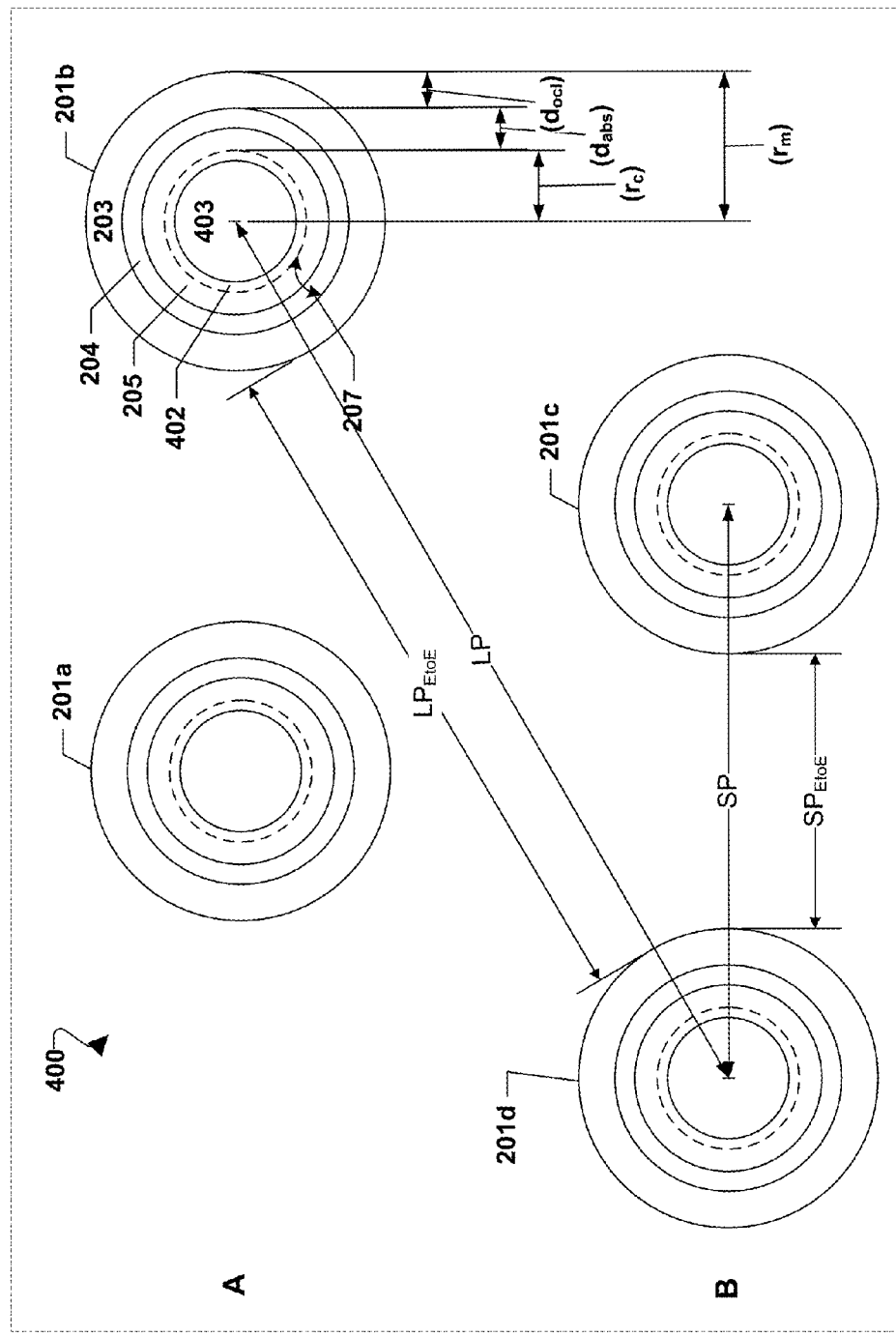
FIG. 4A is a cross-sectional top view of a section of an embodiment in which photovoltaic bristles have a layered conductive core and two absorber sublayers or regions.
Figure 4B:
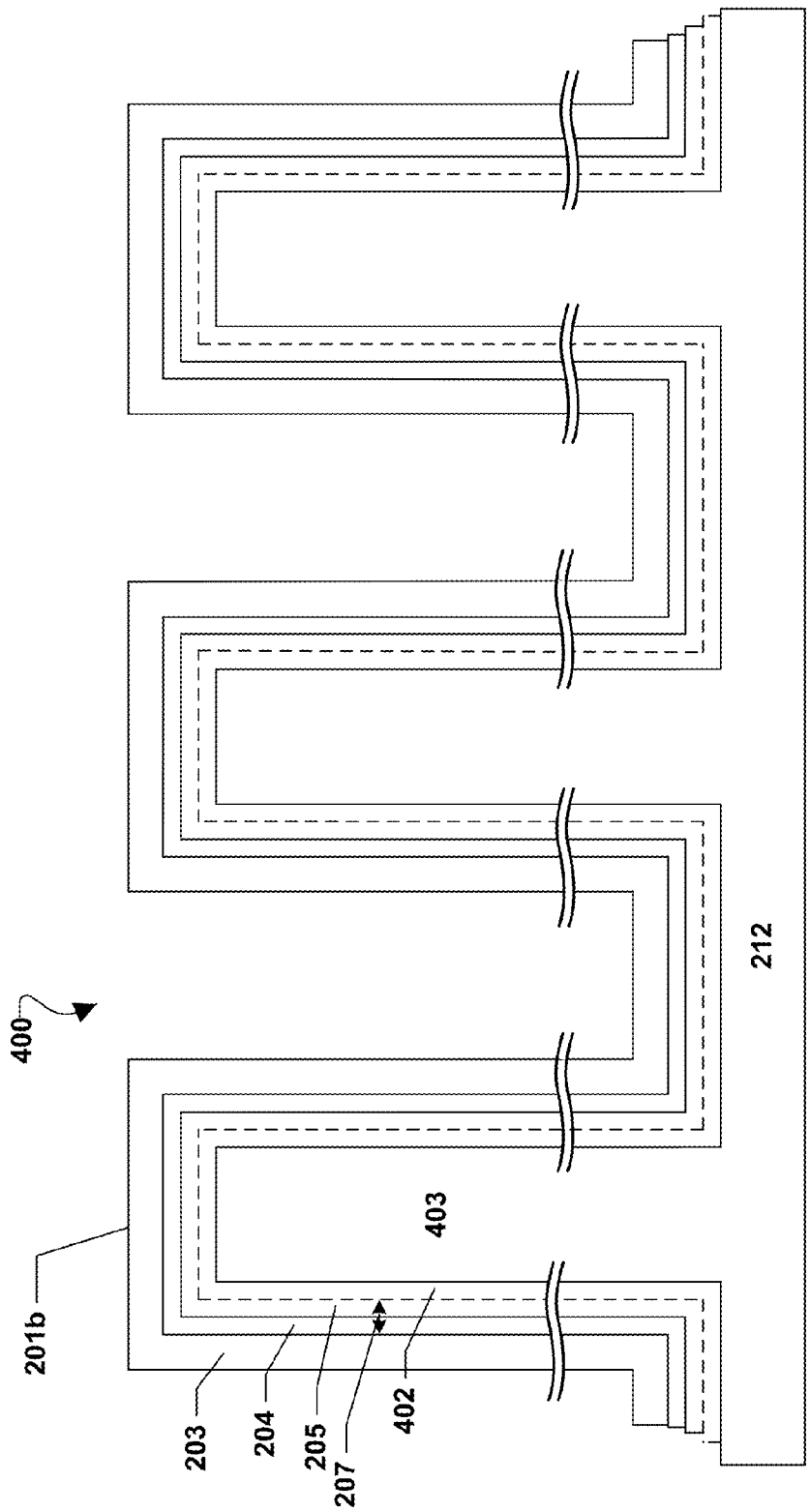
FIG. 4B is a cross-sectional side v view of the photovoltaic bristles illustrated in FIG. 4A.
Figure 4C:
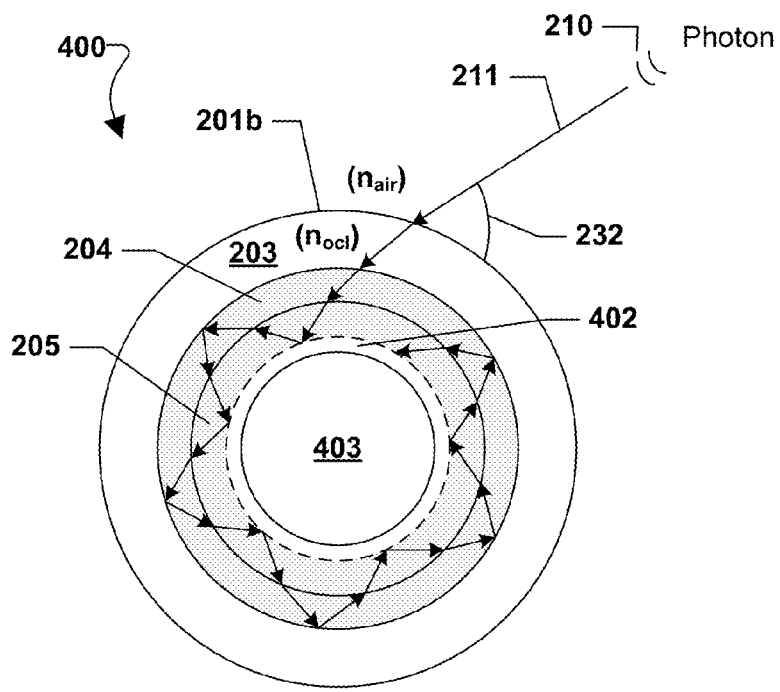
FIG. 4C is a cross-sectional top view of one of the photovoltaic bristles illustrated in FIG. 4A.
Figure 4D:
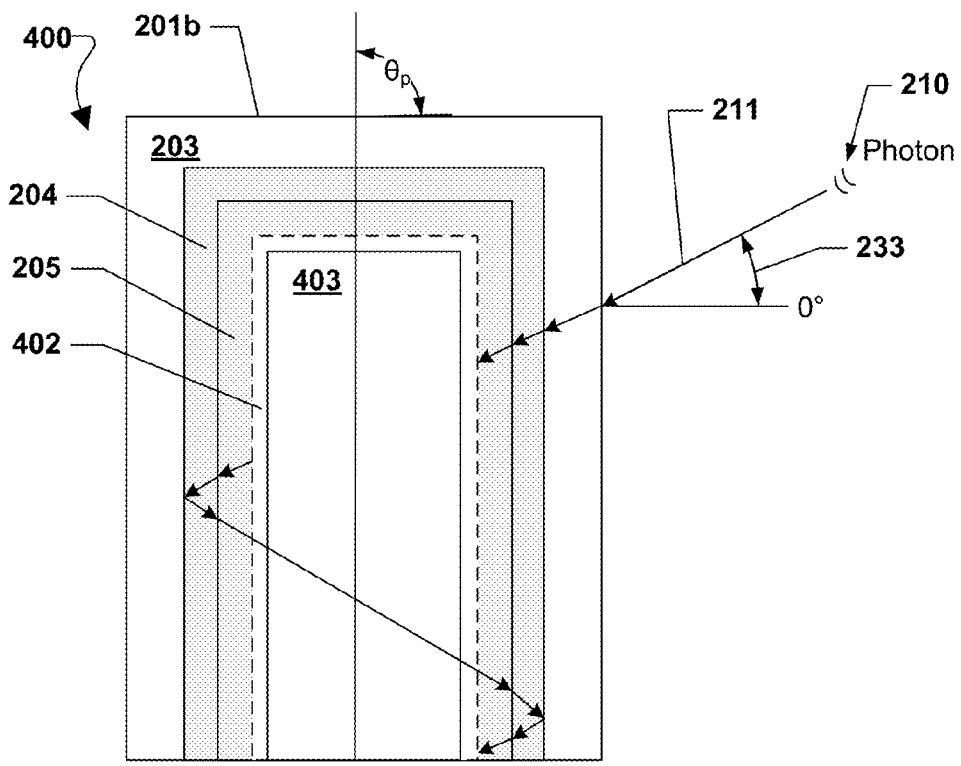
FIG. 4D is a cross-sectional side view of one of the photovoltaic bristles illustrated in FIG. 4A.
Figure 5A:
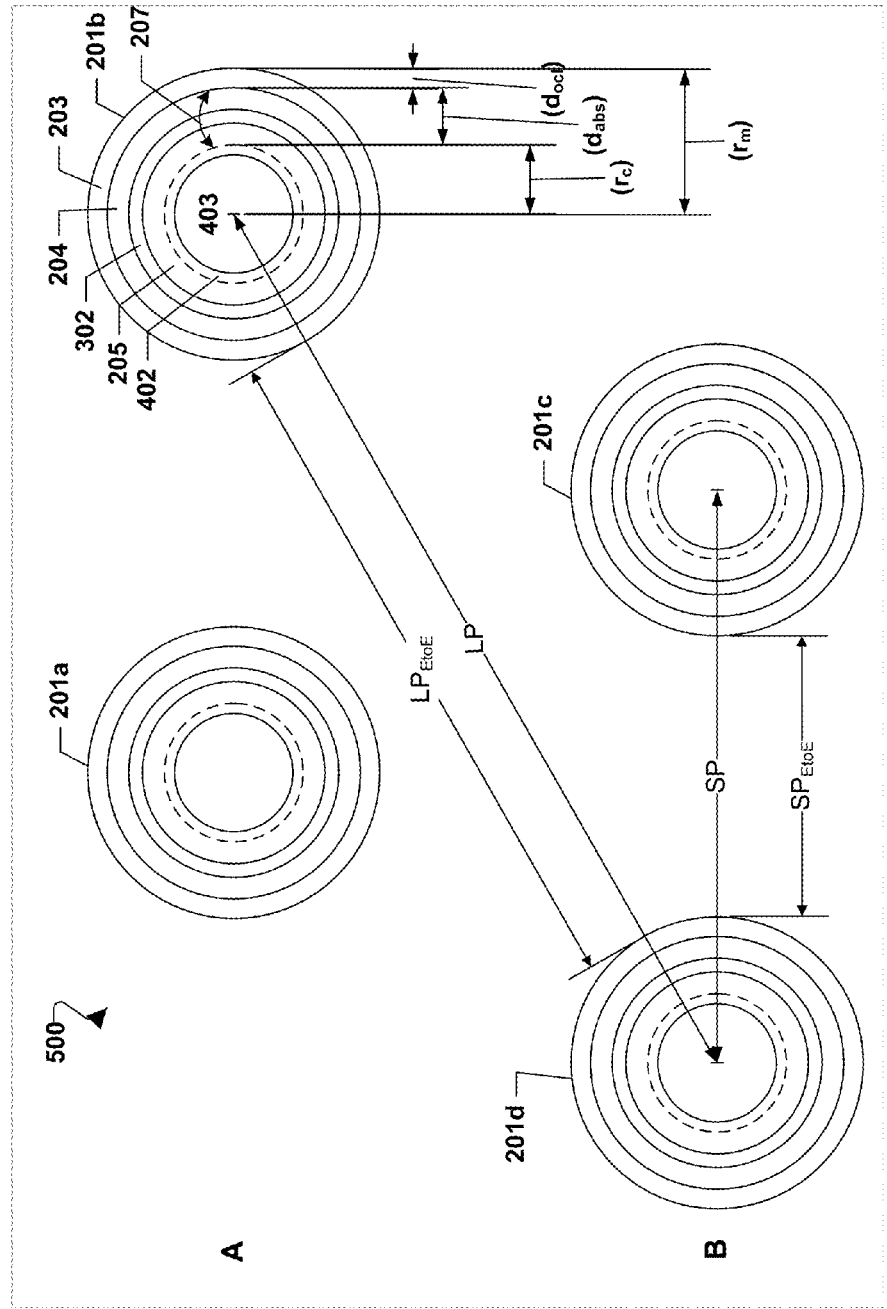
FIG. 5A is a cross-sectional top view of a section of an embodiment in which photovoltaic bristles have a layered conductive core and three absorber sublayers or regions.
Figure 5B:
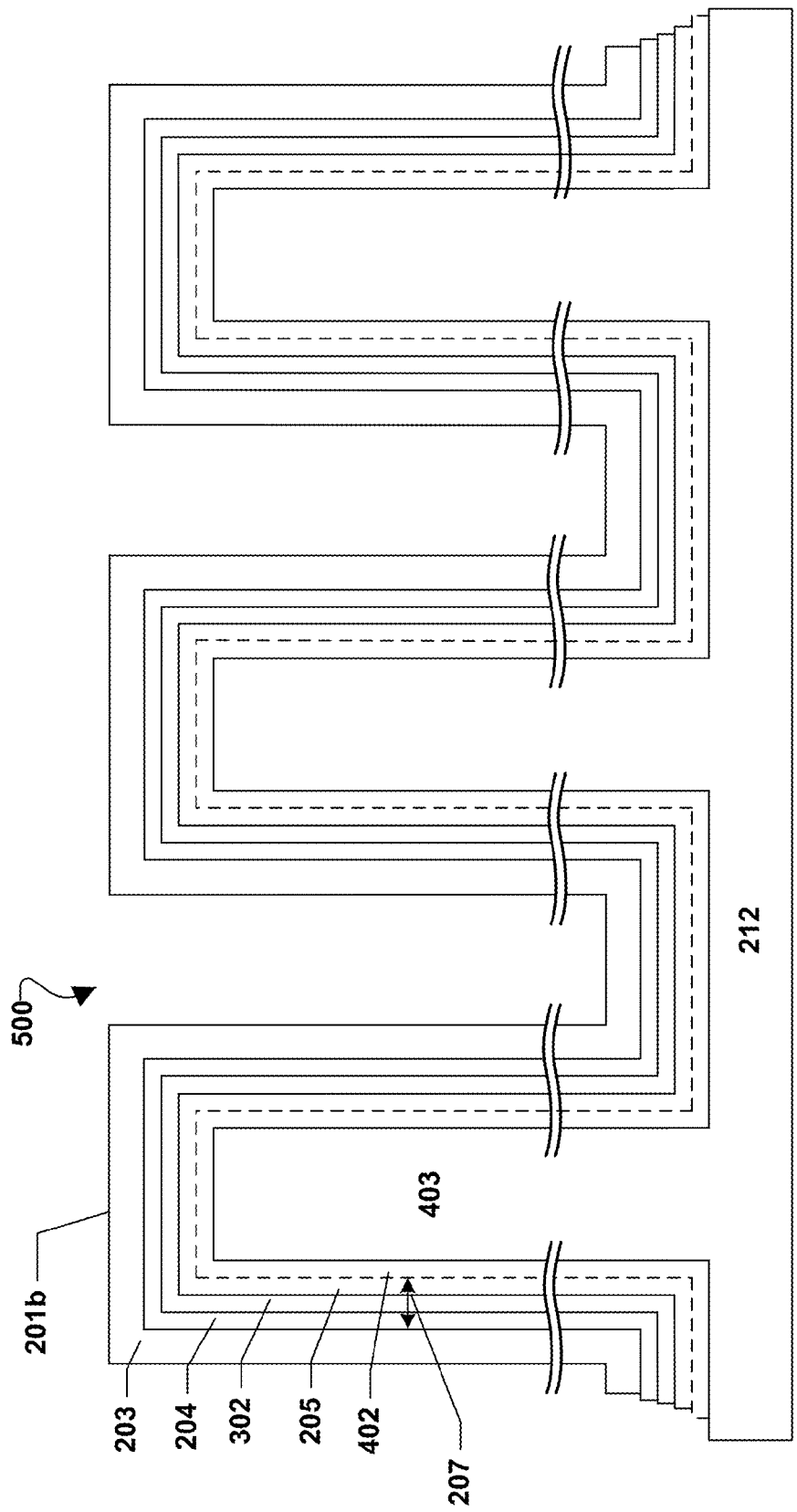
FIG. 5B is a cross-sectional side view of the photovoltaic bristles illustrated in FIG. 5A.
Figure 5C:
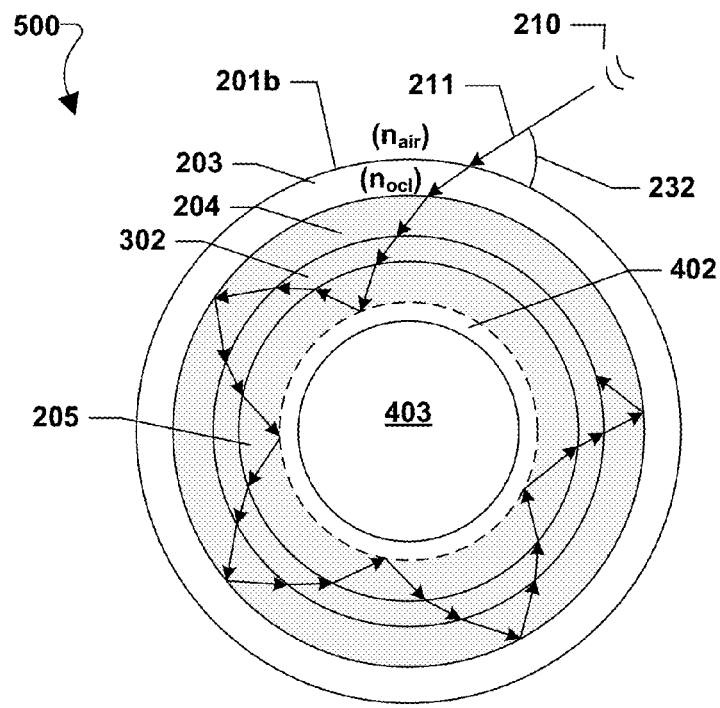
FIG. 5C is a cross-sectional top view of one of the photovoltaic bristles illustrated in FIG. 5A.
Figure 5D:
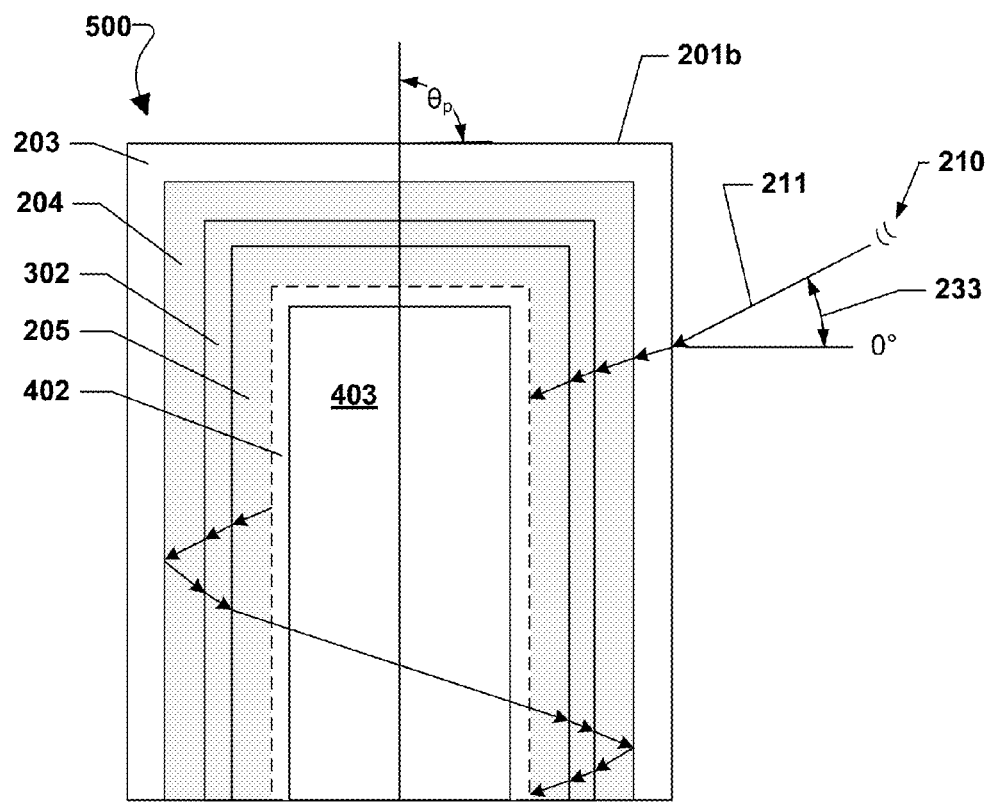
FIG. 5D is a cross-sectional side view of one of the photovoltaic bristles illustrated in FIG. 5A.
Figure 6A:
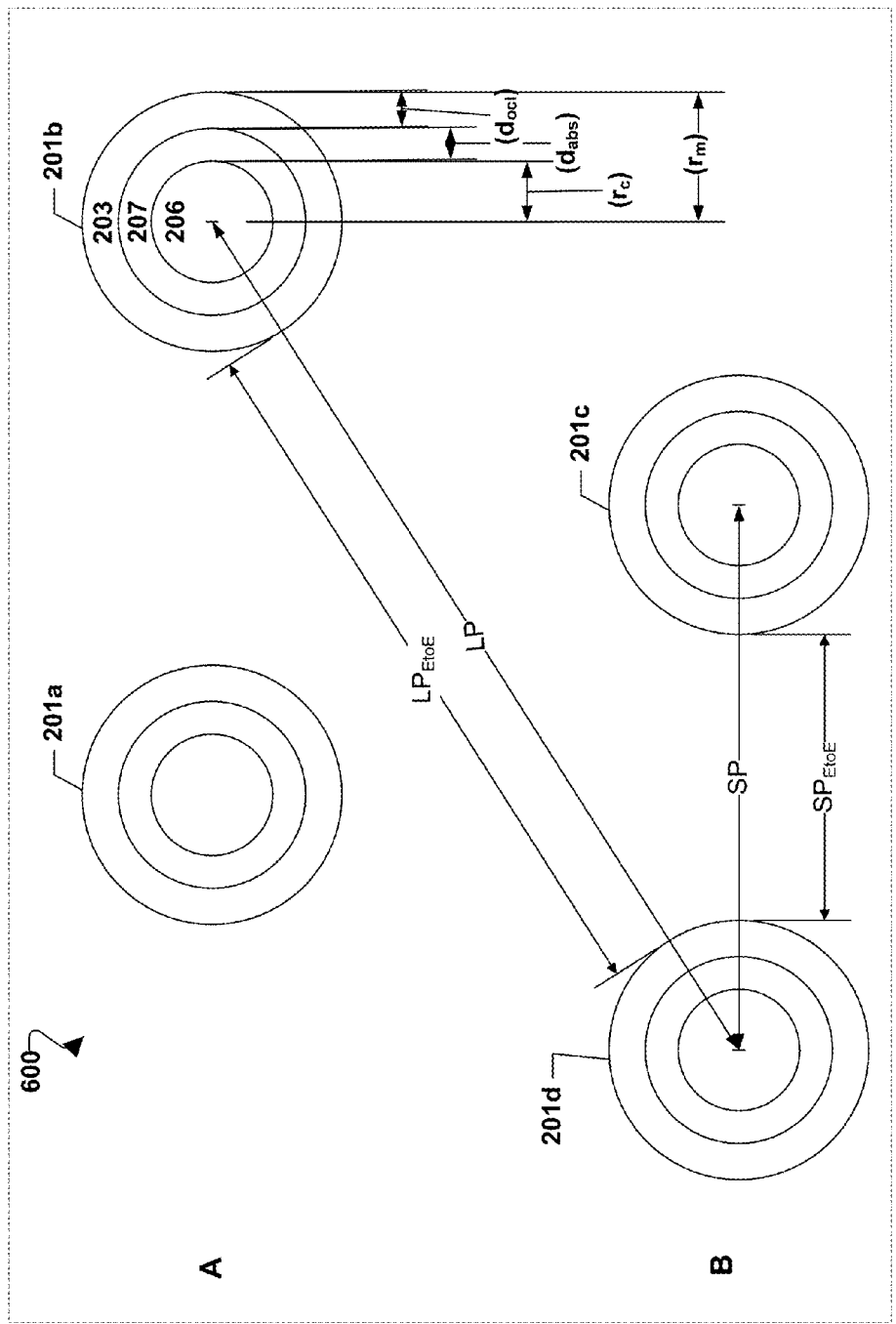
FIG. 6A is a cross-sectional top view of a section of an embodiment in which photovoltaic bristles have a semiconductor core and one absorber sublayer.
Figure 6B:
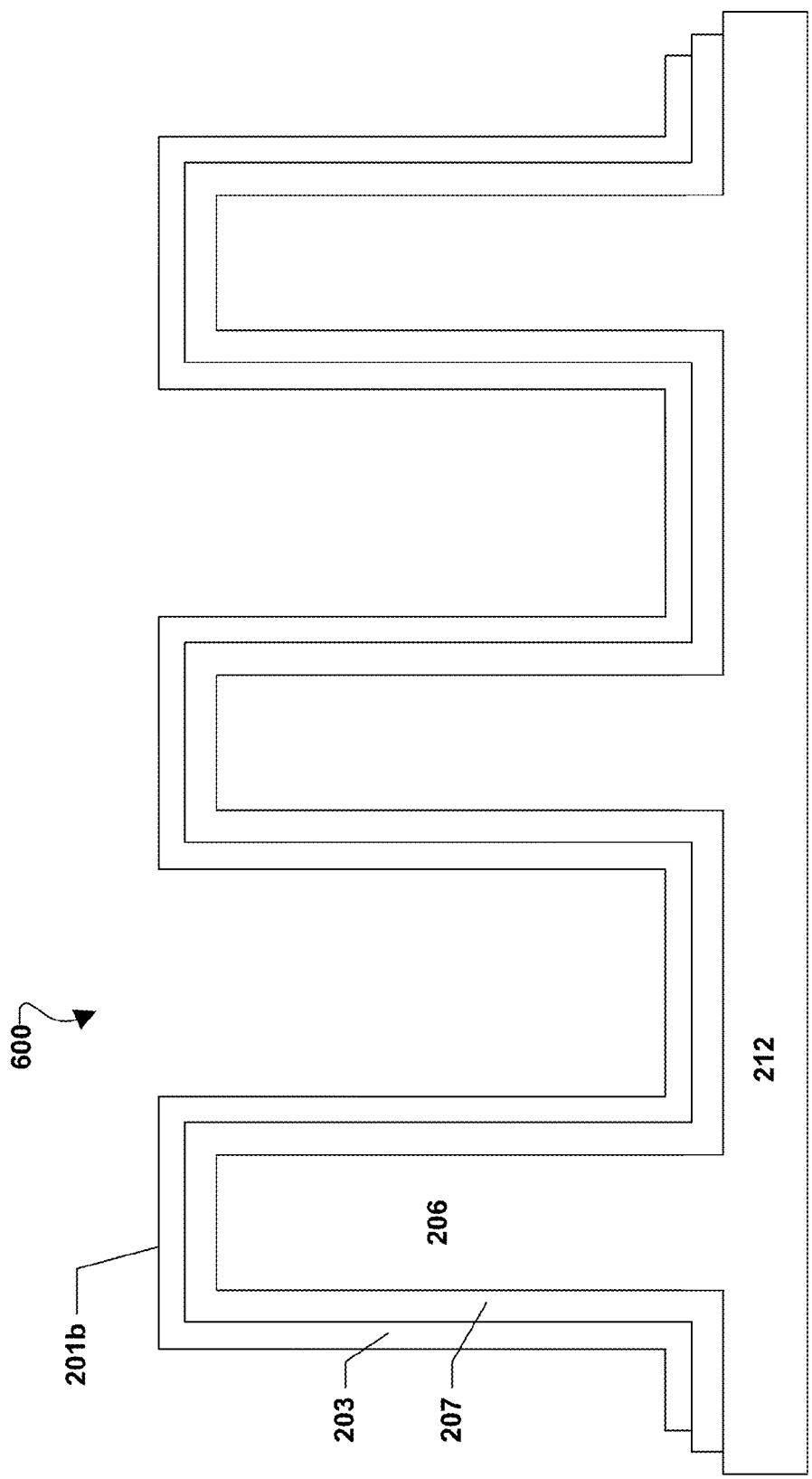
FIG. 6B is a cross-sectional side view of the photovoltaic bristles illustrated in FIG. 6A.
Figure 6C:
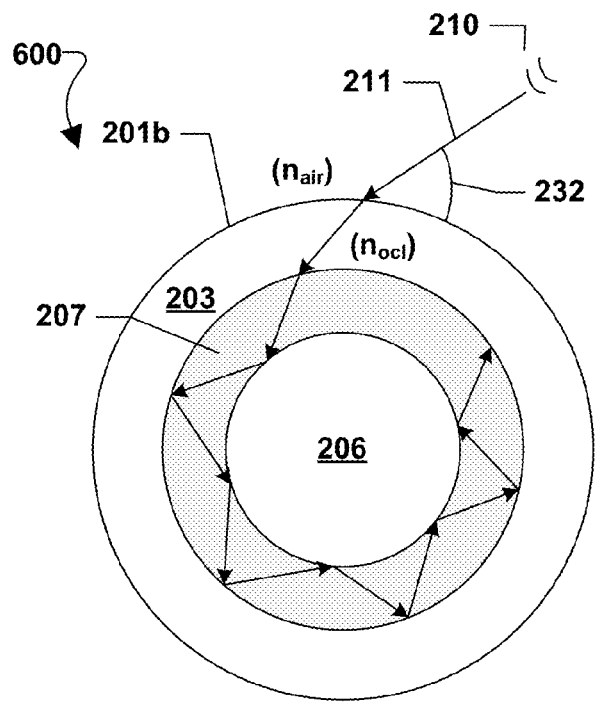
FIG. 6C is a cross-sectional top view of one of the photovoltaic bristles illustrated in FIG. 6A.
Figure 6D:
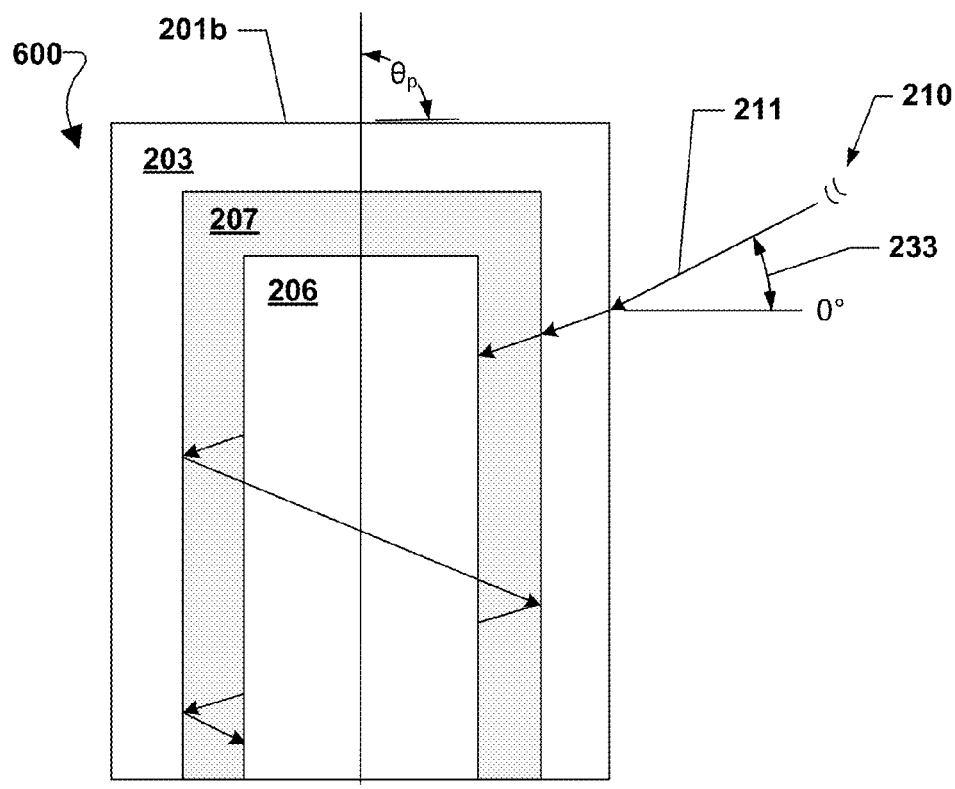
FIG. 6D is a cross-sectional side view of one of the photovoltaic bristles illustrated in FIG. 6A.
Figure 7A:
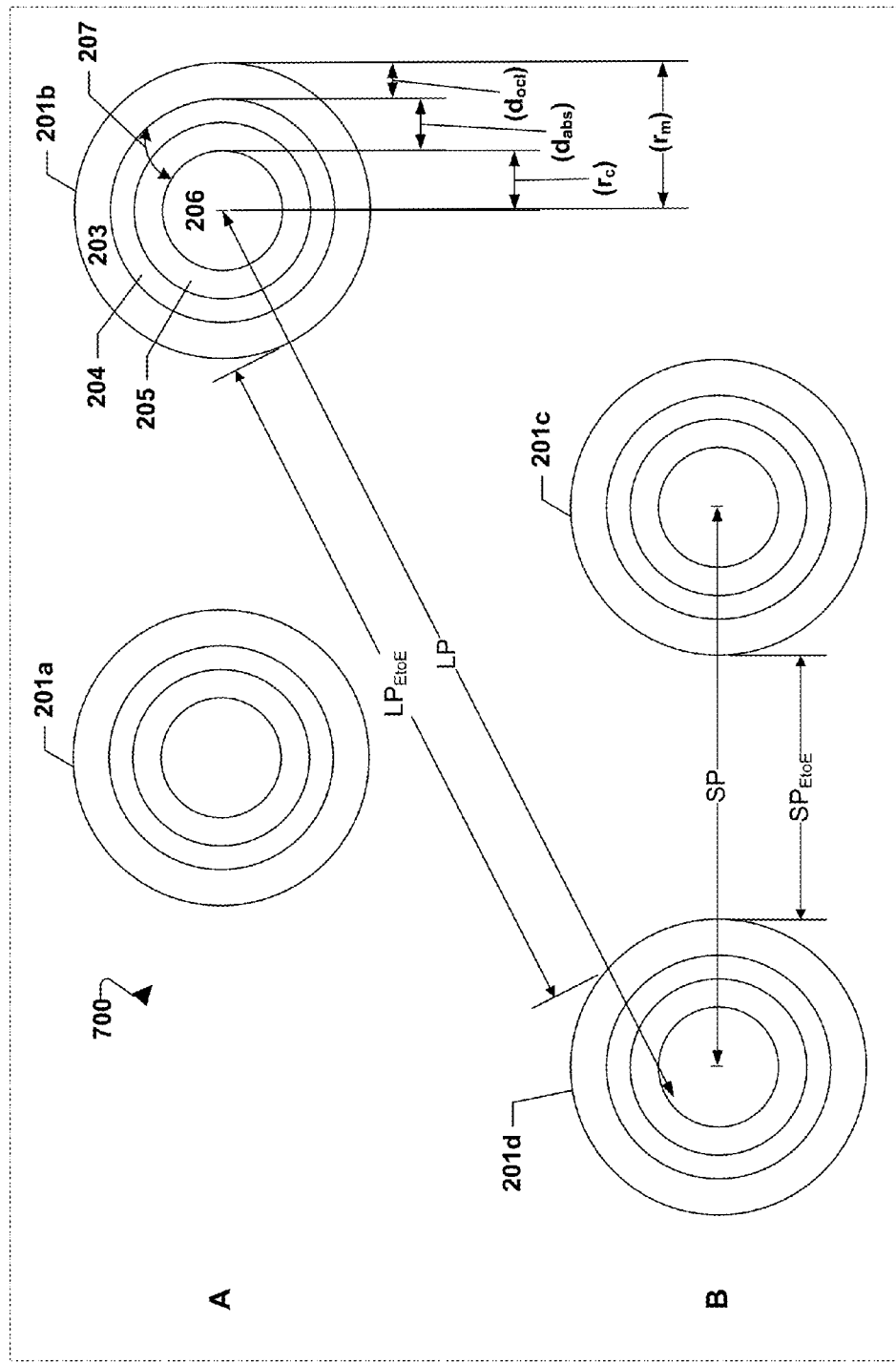
FIG. 7A is a cross-sectional top view of a section of an embodiment in which photovoltaic bristles have a doped semiconductor core and two absorber sublayers or regions.
Figure 7B:
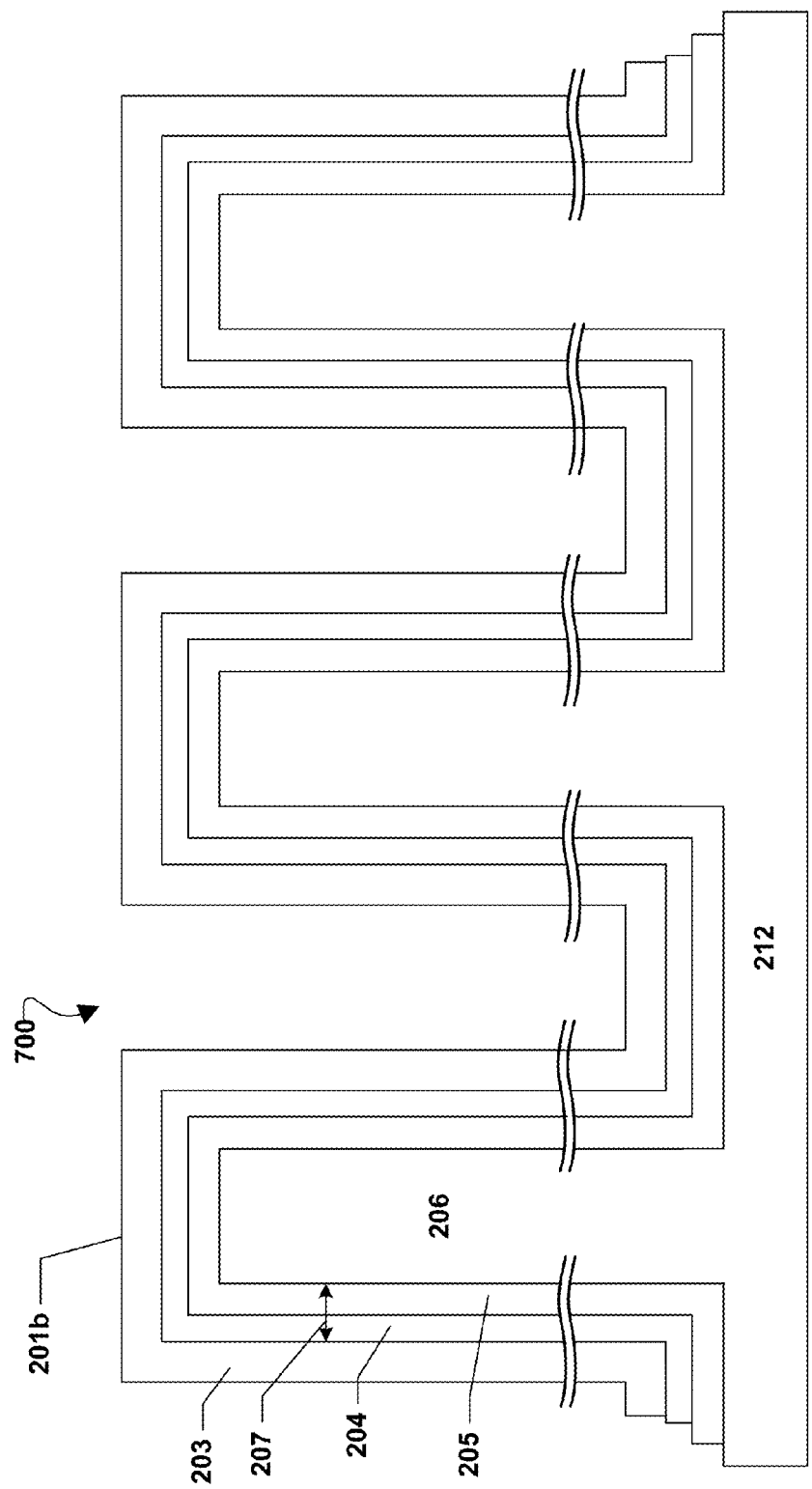
FIG. 7B is a cross-sectional side view of the photovoltaic bristles illustrated in FIG. 7A.
Figure 7C:
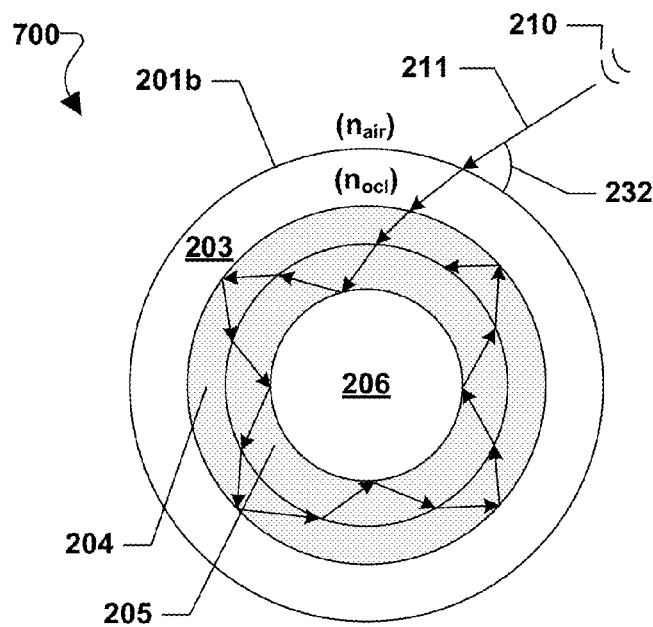
FIG. 7C is a cross-sectional top view of one of the photovoltaic bristles illustrated in FIG. 7A.
Figure 7D:
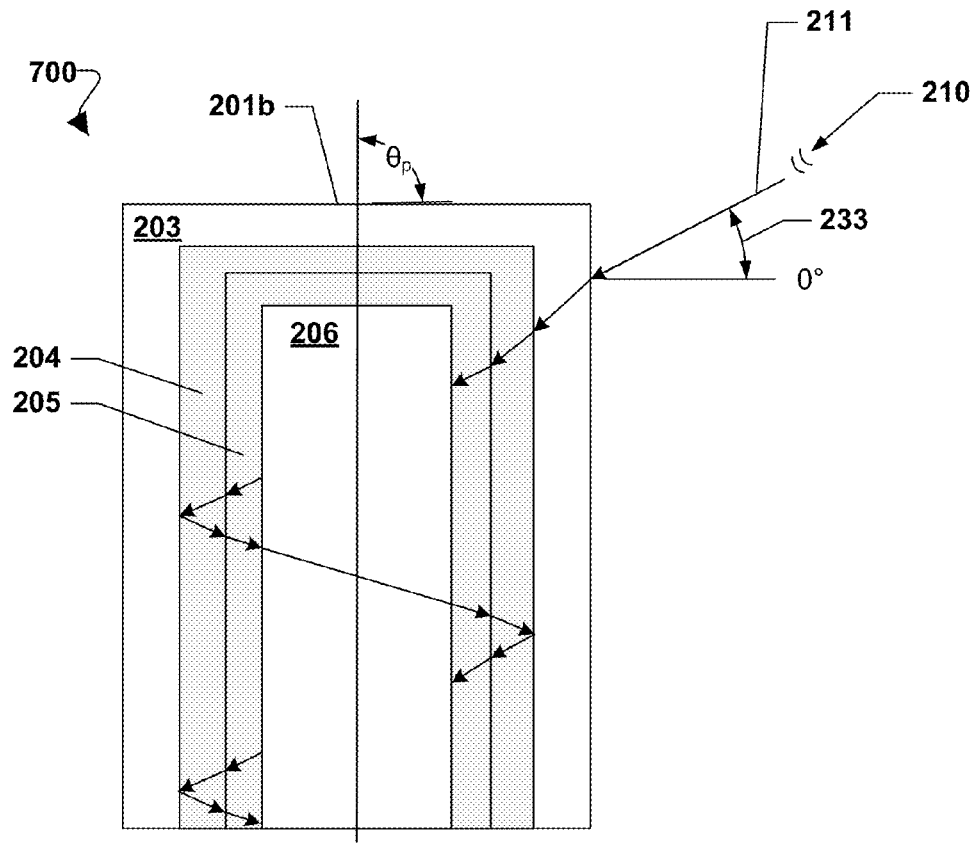
FIG. 7D is a cross-sectional side view of one of the photovoltaic bristles illustrated in FIG. 7A.

In an embodiment, the materials of the various layers may be selected so that the index of refraction of the outer conductive layer ($n_{ocl}$) is greater than the index of refraction of air ($n_{air}$), the index of refraction of the outer conductive layer ($n_{ocl}$) is less than the index of refraction of the first absorber sublayer 204, the index of refraction of the first absorber sublayer 204 is less than the index of refraction of the third absorber sublayer 302, and the index of refraction of the third absorber sublayer 302 is less than the index of refraction of the second absorber sublayer 205. In an alternate embodiment, the materials of the various layers may be selected so that the index of refraction of the outer conductive layer ($n_{ocl}$) is less than the index of refraction of the absorption layer 207 which is made up of the three absorber regions 204, 302, 205. As described above, by selecting the layer materials so that there indices of refractions very from a low index of refraction on the outside to a higher index of refraction in each layer moving radially inward, the photovoltaic bristle 201b may refract or guide photons 210 toward the core 206 of the photovoltaic bristle 201b as illustrated in FIGS. 3C and 3D.

FIGS. 4A, 4B, 4C, and 4D illustrate an embodiment photovoltaic cell 400 featuring photovoltaic bristles with to sublayers 204, 205 within the absorption layer 207 (similar to the embodiment described above with reference to FIGS. 2A-2D), in which the cores of the photovoltaic bristles may be in the form of a non-conductive center core 403 that is covered by a conductive layer 402. For ease of reference, the conductive layer 402 over the non-conductive center core 403 is referred to herein as the "inner conductive layer" in order to distinguish it from the transparent conducting oxide layer 203, which may be referred to as the "outer conductive layer."

In this embodiment, the radius of the core ($r_c$) may be measured from the center of the non-conductive center 403 to the outer surface of the inner conductive layer 402.

In an embodiment, the inner conductive layer 402 may be a metal or metal alloy, such as gold, copper, nickel, molybdenum, iron, aluminum, silver or alloys of the same. In an embodiment, the non-conductive center 403 may include a polymer, glass, a composite material, or a semiconductor material.

The embodiment illustrated in FIGS. 4A, 4B, 4C, and 4D may exhibit energy conversion performance characteristics that are similar to embodiments featuring a solid conductive core when designed according to the embodiment methods described above, with the added benefit of enabling (the) use of less-expensive or easier to process materials or (for) the bristle course (cores). For example, this embodiment would enable production of photovoltaic bristles with plastic or polymer cores, such as could be manufactured using stamping, pressing or molding techniques. While using such materials may require adjustments in the diameter of the core in order to achieve desirable manufacturing yields, the embodiment design methods described above enable the design of embodiment photovoltaic cells with similar performance characteristics.

FIGS. 5A, 5B, 5C, and 5D illustrate an embodiment photovoltaic cell 500 in which the absorption layer 207 in the photovoltaic bristles 201a-201d include three absorber sublayers or regions 204, 302, 205, and non-conductive core centers 403 covered with an inner conductive layer 402 is described above. Thus, this embodiment is an example of a combination of the embodiments described above.

FIGS. 6A, 6B, 6C, and 6D illustrate an embodiment photovoltaic cell 600 in which the absorption layer 207 of photovoltaic bristles comprises a single layer and the core 206 comprises a semiconductor. In this embodiment, the semiconductor core 206 may be made from a p-type or n-type semiconductor material so that the junction of the absorption layer 207 and the semiconductor core 206 form a p-n junction suitable to convert photons into electro-hole pairs.

In an embodiment, the semiconductor core 206 may be a p-type semiconductor material and the absorber sublayer 207 may be a n-type semiconductor material. Alternatively, the semiconductor core 206 may be a n-type semiconductor material and the absorber sublayer 207 may be a p-type semiconductor material. In an embodiment, the semiconductor material for the core 206 and the absorber sublayer 207 may be different materials. For example, the semiconductor core 206 may be p-type cadmium telluride and the absorber sublayer 207 may be n-type cadmium sulfide. As another example, the semiconductor core 206 may be n-type cadmium sulfide and the absorption layer 207 may be p-type cadmium telluride.

In another embodiment, the semiconductor materials for the semiconductor core 206 and the absorber sublayer 207 may be the same semiconductor materials. For example, the semiconductor core 206 may include a p-type amorphous silicon and the absorber sublayer 207 may include a n-type amorphous silicon. Alternatively, the semiconductor core 206 may include a n-type amorphous silicon and the absorber sublayer 207 may include a p-type amorphous silicon. The semiconductor core 206 may made from one or more of silicon, amorphous silicon, polycrystalline silicon, single crystal silicon, cadmium telluride, gallium arsenide, aluminum gallium arsenide, cadmium sulfide, copper indium selenide, and copper indium gallium selenide. The absorber sublayer 207 may be made from one or more of silicon, amorphous silicon, polycrystalline silicon, single crystal silicon, cadmium telluride, gallium arsenide, aluminum gallium arsenide, cadmium sulfide, copper indium selenide, and copper indium gallium selenide.

FIGS. 7A, 7B, 7C, and 7D illustrate an embodiment photovoltaic cell 700 in which the core 206 of the photovoltaic bristles is made from a semiconductor, and the absorption layer 207 is made up of two absorber sublayers 204, 205, the inner layer of which combines with the semiconductor core 206 so that a p-i-n junction is formed. In an embodiment, the semiconductor core 206, the absorber sublayer 205, absorber sublayer 204 may be a p-type semiconductor material, an intrinsic semiconductor material, and a n-type semiconductor material, respectively. In another embodiment, the semiconductor core 206, the absorber sublayer 205, and the absorber sublayer 204 may be a n-type semiconductor material, an intrinsic semiconductor material, and a p-type semiconductor material, respectively.

In an embodiment, the semiconductor material for the core 206 and the absorber sublayers 204, 205 may be different materials. For example, the core 206, the absorber sublayers 205, 204 may include p-type cadmium telluride, intrinsic cadmium telluride, and n-type cadmium sulfide, respectively. In an alternative example, the core 206 and the absorber sublayers 205, 204 may include a n-type cadmium sulfide, intrinsic cadmium telluride, and a p-type cadmium telluride, respectively.

In an embodiment, the semiconductor materials for the semiconductor core 206 and the absorber sublayers 204, 205 may be the same semiconductor materials. For example, the semiconductor core 206, the absorber sublayers 205, 204 may include a p-type amorphous silicon, an intrinsic amorphous silicon, and a n-type amorphous silicon, respectively. In an alternative example, the semiconductor core 206 and the absorber sublayers 205, 204 may include a n-type amorphous silicon, an intrinsic amorphous silicon, and a p-type amorphous silicon.

The semiconductor core 206 may be made from one or more of silicon, amorphous silicon, polycrystalline silicon, single crystal silicon, cadmium telluride, gallium arsenide, cadmium sulfide, copper indium selenide, and copper indium gallium selenide. The absorber sublayers or regions 204, 205 may be made from one or more of silicon, amorphous silicon, polycrystalline silicon, single crystal silicon, cadmium telluride, gallium arsenide, cadmium sulfide, copper indium selenide, and copper indium gallium selenide.

Figure 8:
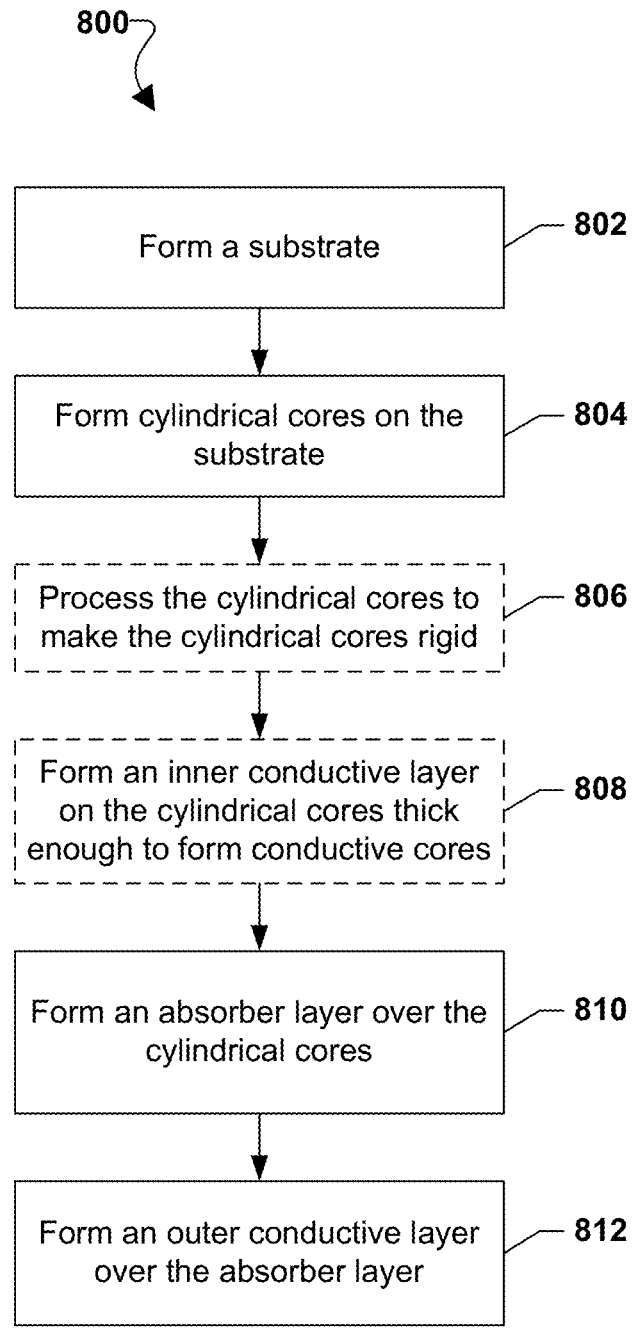
FIG. 8 illustrates an embodiment method for manufacturing photovoltaic cells according to the various embodiments.

FIG. 8 illustrates an embodiment method 800 for manufacturing a photovoltaic cell made up of an array of photovoltaic bristles as described above. In block 802 a substrate may be formed. In an embodiment, the substrate may be formed by selecting a base material and forming the substrate material to a desired shape. As discussed above the substrate may be glass, doped semiconductor, diamond, metal, a polymer, ceramics, or a variety of composite materials.

In block 804 approximately cylindrical cores may be formed on the substrate. In an embodiment, cylindrical cores may be formed by a variety of processes. For example, metal cores may be grown up from the substrate through a mask using plating, vapor deposition and other similar well known processes. As another example, semiconductor cores may be grown up from the substrate using vapor deposition methods well known in the semiconductor processing parts. Plastic polymer cores may be made by molding or stamping cylindrical cores out of the substrate. In another embodiment, cylindrical cores may be formed by depositing a core layer over the substrate and stamping cylindrical cores out of the deposited core layer. In another embodiment, cylindrical cores may be formed by depositing a core layer over the substrate and etching cylindrical cores from the deposited core layer. In another embodiment, cylindrical cores may be formed by placing a template over the substrate and depositing material into the template, thereby forming cylindrical cores. The cores formed in the processes of block 804 may position and size the cores with dimensions and spacing determined using the design equations described above.

In optional block 806 the cylindrical cores may be further processed, such as to increase the structural strength of the cylindrical cores formed in block 804. The operations of optional block 806 may be performed in embodiments in which the cylindrical cores are made of a non-conductive materials, such as a polymer. As an example, the cylindrical cores may be processes to form a rigid shape (e.g., a cylinder) by exposing them to elevated temperatures or electromagnetic radiation that leads to a hardening process. Processes that may be accomplished in optional block 806 may include processes that promote polymerization, cross-linking, or curing to make the material stronger or more rigid.

When the core material is nonconductive, in optional block 808 an inner conductive layer may be formed on the cylindrical cores. In this process, the conductive layer may be applied with the thickness sufficient to conduct the expected amount of current when the photovoltaic cells are exposed to the design level of insolation. In an embodiment, the inner conductive layer may be formed by striking a conductive layer onto the cylindrical cores. In another embodiment, an inner conductive layer may be formed by depositing the inner conductive layer by any of chemical vapor deposition, plasma-enhanced chemical vapor deposition, atomic layer chemical vapor deposition, sputtering, plating, physical vapor deposition, ion plating, and coding with a wet-chemical process.

In block 810 an absorption layer may be formed over the cylindrical cores. In an embodiment, the absorption layer may be formed by sequentially depositing a number of semiconductor sublayers over the core. For example, a p-type cadmium telluride sublayer may be applied followed by application a n-type cadmium sulfide sublayer. In an embodiment, the absorption layer may be deposited using well known semiconductor processing techniques, such as by chemical vapor deposition, plasma-enhanced chemical vapor deposition, atomic layer chemical vapor deposition, physical vapor deposition, ion plating, sputtering, etc. As part of block 810, each of the applied semiconductor sublayers may be further processed, such as to apply a desired level of dopant to generate the p-type or n-type semiconductor material in the region of the junction, and/or to adjust the index of refraction of the layer.

In block 812 an outer conductive layer may be formed over the absorption layer. In an embodiment, the outer conductive layer may be deposited using well known semiconductor and solar cell manufacturing methods, such as by chemical vapor deposition, plasma-enhanced chemical vapor deposition, atomic layer chemical vapor deposition, physical vapor deposition, ion plating, sputtering, etc. As part of block 812, outer conductive layer may be further processed, such as to adjust the index of refraction of the layer.

In an alternative method, the photovoltaic bristles may be created in the reverse direction with a non-solid core. Nano-printing techniques well known in the art may create an array of vias out of an optically transparent material (e.g., a transparent conductive oxide, a transparent conductive nitride, or an optically transparent polymer). Add: "Alternatively vias could be formed by etching or ablation of a glass material". The absorption layer including any number of sublayers may be formed within the vias and as well as over the optically transparent material between the vias. The deposition methods used to deposit the semiconductor layers into vias may be similar to those used in depositing semiconductor layers over the core (e.g., chemical vapor deposition). An inner conductive layer (i.e., a back conductor layer) may be formed within and between the vias over the last semiconductor layer. The inner conductive layer may be added by sputtering or evaporative techniques well known in the art. When the device is completed, the vias are rotated 180 degrees presenting the optically transparent layers is (remove "is") outward. Thus, depending on the material thickness used for the back conductor layer, a void may remain in the vias resulting in a non-solid core.

As mentioned above, in addition to increasing the percentage of photons absorbed and converted into electrical energy, the various embodiment photovoltaic bristle structures also exhibit unexpected improvements in electrical conductivity when exposed to light energy. This effect has been observed in prototypes, and may be due, at least in part, to electric field effects in the transparent conductive layer caused by electric field concentrations at the points of discontinuities (e.g., sharp corners) in the structures. The photovoltaic bristle structure of the various embodiments features discontinuities in the outer conductive layer. These structural discontinuities occur at the base, (i.e., where the bristle couples to the substrate) and near the tip of each bristle. When the photovoltaic bristles are exposed to light the photovoltaic effect in the photovoltaic layer causes electrons and holes to move to the inner and outer conductive layers. Due to the surface shapes at the base and tip of the photovoltaic bristles, which form sharp corners, the electric charge on the surface may be greater in these locations than that exhibited in traditional planar photovoltaic cells. More important, the discontinuities near the connection of the bristle to the substrate and near the tip may result in substantially higher electric fields in the transparent conductive layer in these regions. Testing of prototypes of embodiment photocells have detected surprisingly low resistance of the transparent conducting layer when the cell is exposed to light. This substantial reduction in electrical resistance in the transparent conductive layer may reduce the electrical losses due to resistance through the photovoltaic cell. Consequently, more electricity may be produced from an embodiment photovoltaic cell than would be expected considering the normal resistance of outer conductive layer materials.

While the specific physics involved in reducing the electrical resistance of the outer conductive layer (e.g., a transparent conductive oxide) are not fully understood, testing of the prototypes suggests that the effect may be related to the electric field concentrations in the structural discontinuities at the tip and base of the photovoltaic bristles. One possible explanation, although not intended to be a limitation on the claims, is that the electric field concentrations in these regions of the photovoltaic bristles result in a change in the electrical resistance of the materials similar to what occurs in a field effect transistor when an electric field is applied. By significantly decreasing the electrical resistance in the regions of high electric field concentrations, the average electrical resistance through the outer conductive layer across an array of photovoltaic bristles may be substantially reduced. This effect is believed to be related to shapes and sizes of embodiment photovoltaic bristle structures, and thus unique to the structures of the various embodiments.

Figure 9:
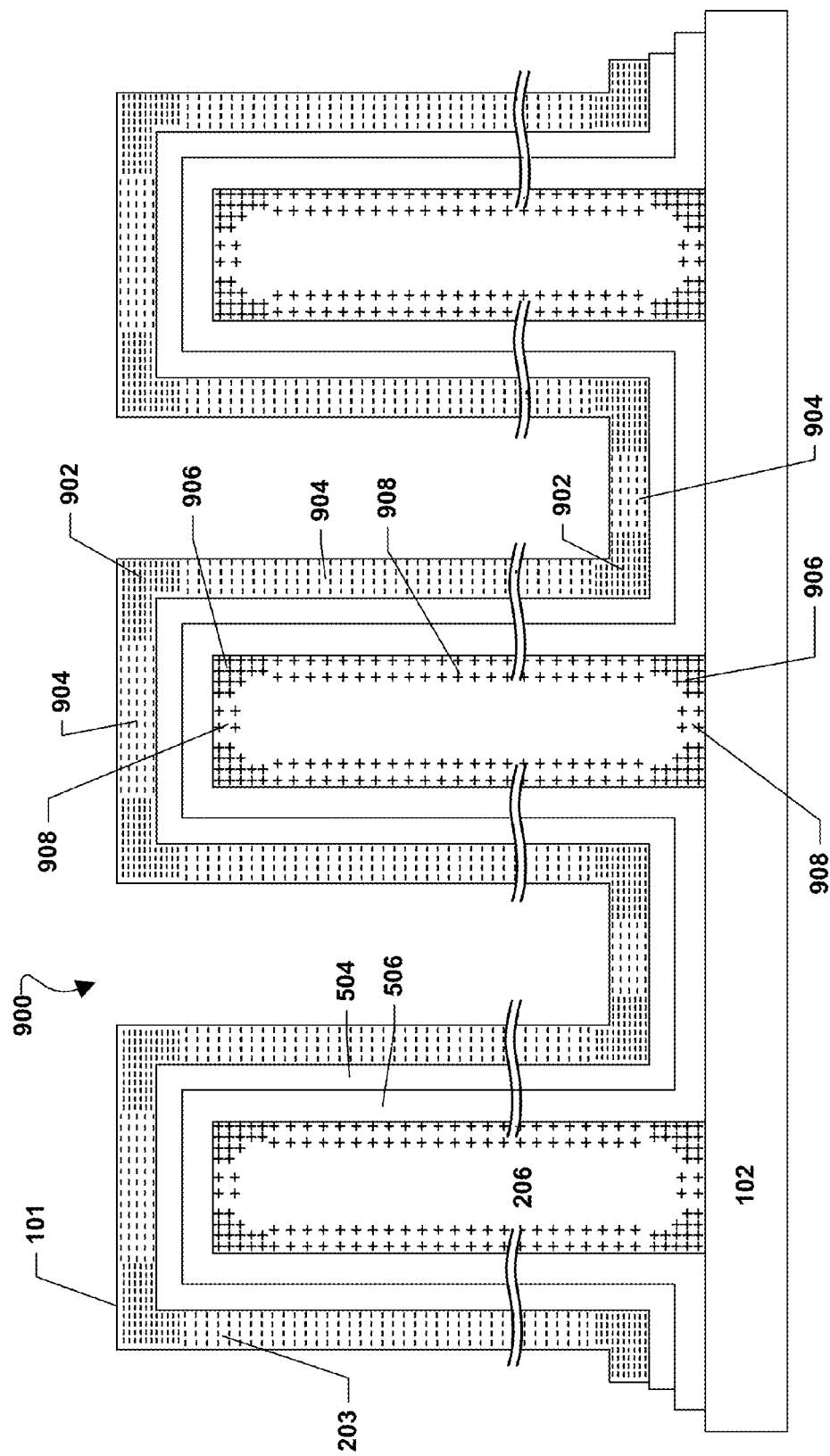
FIG. 9 is a cross-sectional side view of an array of photovoltaic bristles illustrating charge concentrations at structural discontinuities, which may occur when the array is exposed to light.

The electric field concentration effects are illustrated in FIG. 9. FIG. 9 illustrates an embodiment in which the semiconductor materials in the absorption sublayers 504, 506 are arranged such that electrons migrate to the outer conductive layer 203 and holes migrate to the conductive core 206. This is strictly for illustration purposes, because in other embodiments the polarity of the absorption sublayers 504, 506 may be reversed such that electrons migrate to the conductive core 206. As illustrated in FIG. 9, electrons and holes along the length of the photovoltaic bristles (i.e. in the regions 904 and 908) will flow through the inner and outer conductive layers 206, 203, resulting in an average field concentration that is a function of the rate of photon absorption. Current flowing from these regions 904 and 908 to the conductors on the substrate 102 will encounter structural discontinuities where the bristle joins the substrate, which can lead to a concentration of charges 902, 906. Similar field concentrations may occur near the corners the tips of the photovoltaic bristles as illustrated. This concentration of charges at the tips and base of the photovoltaic bristles may result in an increased electric field between the concentrations electrons 902 on one conductive layer and of holes 906 on the opposite conductive layer. This local concentration electrons and holes may result in a locally enhanced electric field, which is believed to be at least part of cause the observed reduced electrical resistance in the outer conductive layer.

Figure 10A:
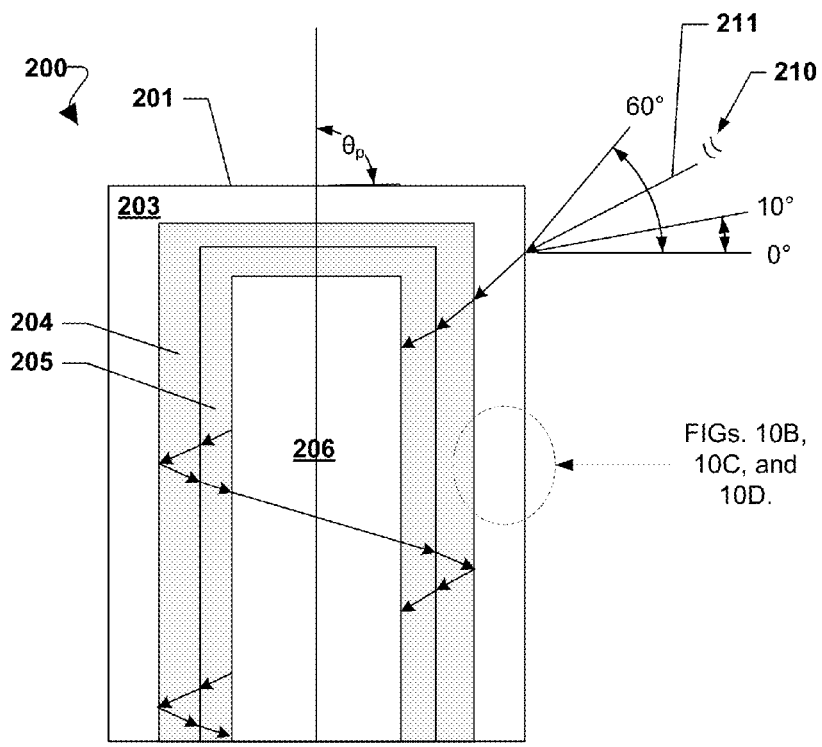
FIGS. 10A-10D illustrates embodiments of the outer conductive layer including multiple sublayers.

FIG. 10A-10D illustrates the multiple embodiments for the outer conductive layer 203. FIG. 10A illustrates that the outer conductive layer 203 may comprise multiple layers as shown in the examples in FIGS. 10B-10C. Although FIGS. 10B-10C only illustrate up to three sublayers within the outer conductive layer 203, any number of sublayers and combinations of materials for these sublayers are envisioned. For example, an outer conductive layer may include five sublayers with three thin conductive sublayers separated by two non-conductive sublayers. By including multiple sublayers, the outer conductive layer 203 may include a total thickness that achieves the proper optical depth ($d_{ocl}$) for enhanced transmissive properties in the design equations while also including a thin conductive sublayer providing the added field effect benefits described above. Additionally, the multiple sublayers within the outer conductive layer 203 may add flexibility to each photovoltaic bristle 201.

Figure 10B:
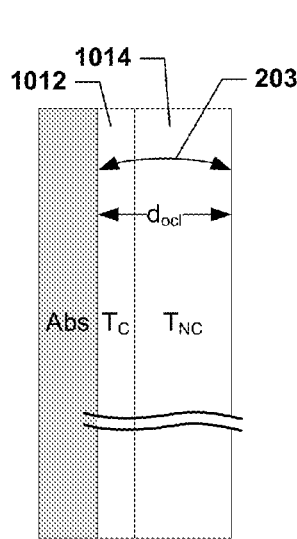
Figure 10C:
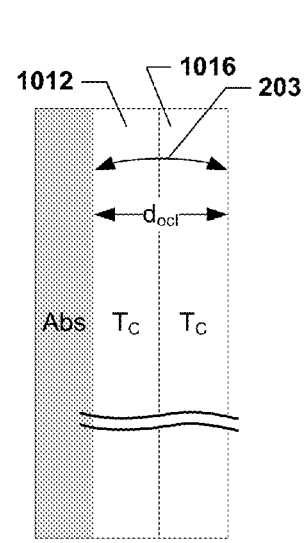
Figure 10D:
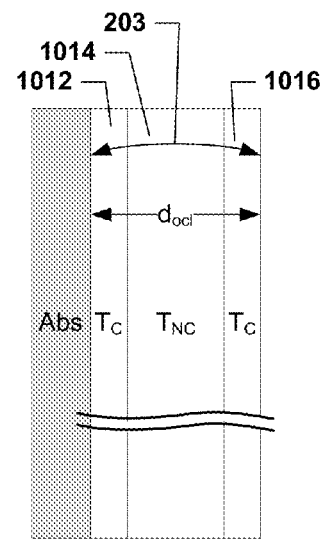

To help achieve an outer conductive layer 203 thick enough to exhibit high transmissive properties while simultaneously thin enough to exhibit the field effect benefits within each photovoltaic bristle 201, the outer conductive layer 203 may include two sublayers including a conductive sublayer 1012 ($T_C$) and a non-conductive sublayer 1014 ($T_{NC}$) as shown in FIG. 10B. The conductive sublayer may be any suitable transparent conductive material with a thickness of approximately 500 to 15,000 angstroms. Some suitable transparent conductive materials may include, a transparent conductive oxide (e.g., indium tin oxide, zinc oxide, titanium oxide, etc), a transparent conductive nitride (e.g., titanium nitride), or a transparent conductive polymer. Alternatively, the conductive sublayer 1012, may include a thin metal conductor such as gold or nickel to achieve a high conductive field effect. The non-conductive sublayer 1014 may be any optically transparent material known in the art such as a non-conductive optically transparent polymer, an optically transparent gel, or a dielectric layer, which makes up the difference between the thin conductive sublayer 1012 and the required thickness ($d_{ocl}$) for the entire outer conductive layer 203. The non-conductive sublayer 1014 and the conductive sublayer 1012 may match the required index of refraction ($n_{ocl}$) for the outer conductive layer 203. Instead of including a non-conductive sublayer 1014, the outer conductive layer 203 may include two different conductive sublayers 1012, 1016 as shown in FIG. 10C. For example, the outer conductive layer 203 may include a transparent conductive oxide such as titanium oxide ($TiO_2$) and a transparent conductive nitride such titanium nitride (TiN). The two conductive sublayers 1012, 1016 may combine to achieve the required optical depth ($d_{ocl}$) for the design formulas while individually being thin enough to exhibit the field effect benefits. In an embodiment, the outer conductive layer 203 may include three sublayers such as a non-conductive sublayer 1014 separating two conductive sublayers 1012, 1016 as shown in FIG. 10D. The two conductive sublayers 1012, 1016 may each exhibit field effects leading the outer conductive layer 203 and the photovoltaic bristle 201 to have benefits from the multiple field effects. Additionally, the non-conductive sublayer 1014 combined with the two conductive sublayers 1012, 1016 may provide better transmissive properties by achieving a desired total thickness in the outer conductive layer 203 as well as adding flexibility to the photovoltaic bristle 201 than only having a single thin conductive layer exhibiting field effects.

As described above, reductions in resistance of the transparent conductive layer due to electric field effects transparent conduction allows for the use of very thin transparent conductive layers in embodiment photovoltaic bristles. Prototype embodiment photovoltaic cells have been manufactured with transparent conductive layers with a thickness of 1500 angstroms. Based on analysis and such testing, it is believed that thinner transparent conductive layers may be achievable. Thinning the transparent conductive layers may enable the use of smaller diameter cores and/or the addition of a transparent optical layer over the transparent conductive layer.

Figure 11:
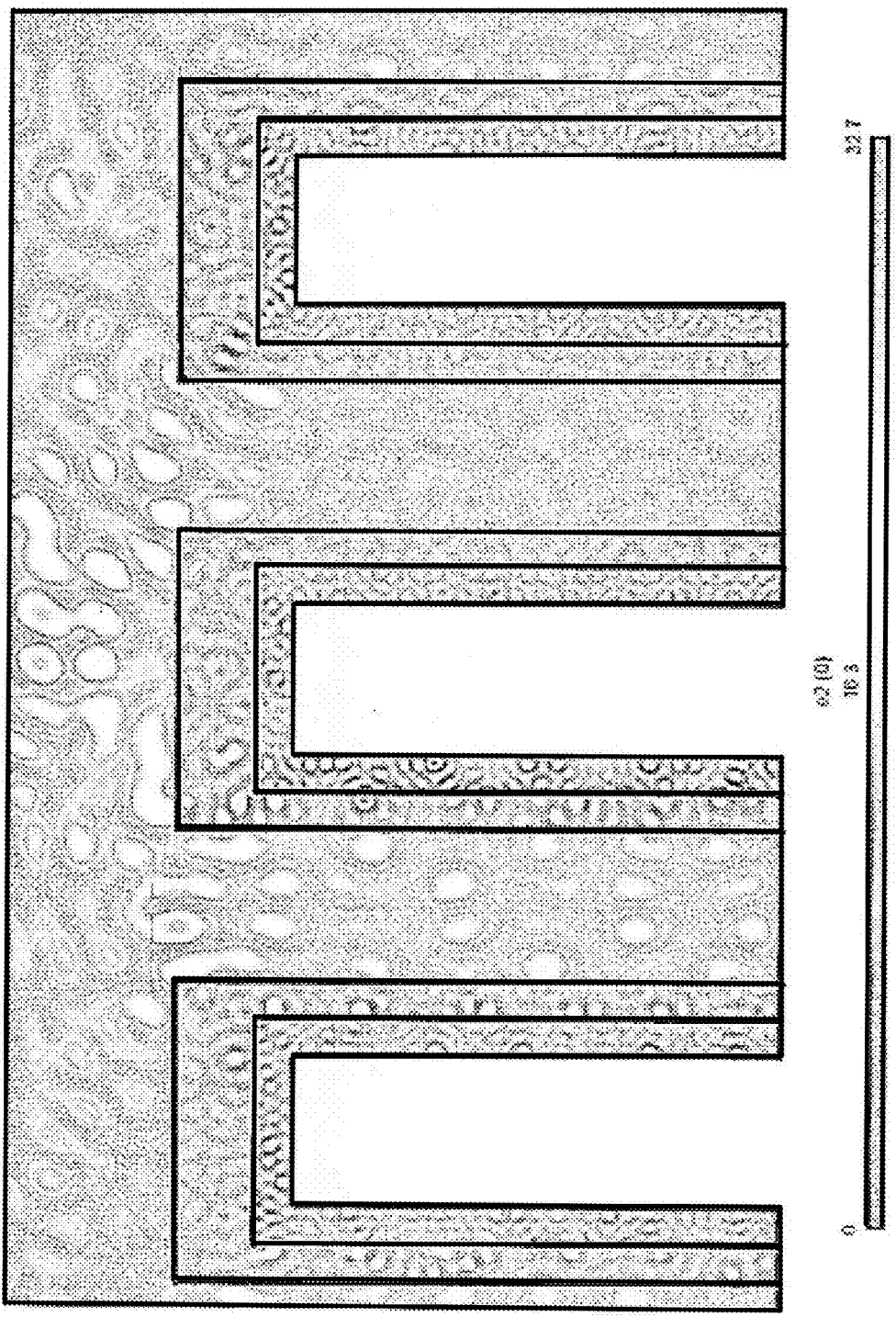
FIG. 11 is a cross-sectional view of an array of photovoltaic bristles superimposed with an electro-magnetic field strength graphic illustrating the results of an electro-dynamics analysis of photon interactions with the photovoltaic bristle's absorption layer using.

As mentioned above, the wave interactions of photons with arrays of photovoltaic bristles designed according to the embodiment design equations described above have been analyzed using classical electrodynamics and quantum mechanical models. These electrodynamic and quantum mechanical models take into account the wave interactions of photons with the regular and close spaced array of photovoltaic bristles, as well as the wave interactions with the transparent conducting oxide layer, and other layers in the design. These electrodynamic and quantum mechanical models also account for the internal refraction characteristics described above that are enabled by properly selecting the layer materials and thicknesses. These analyses reveal that a large fraction of the photons entering an embodiment array of photovoltaic bristles are absorbed into the bristles, where a large fraction of the incident photons are absorbed in the photovoltaic materials. These analysis results are illustrated in FIG. 11 which illustrate the probability of finding a photon at a given location in terms of brightness (i.e., dark regions are where there is a low probability that a photon exists). Specifically, FIG. 11 illustrates that photons striking an array of photovoltaic bristles are quickly absorbed into and largely remain trapped within the transparent conducting oxide and photovoltaic absorption layers.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A photovoltaic cell, comprising:
   an array of photovoltaic bristles located over a substrate, wherein each photovoltaic bristle comprises:

a core having a core radius ($r_c$) in the range of about 0.5 microns to 50 microns;

a portion of a contiguous absorption layer comprising photovoltaic semiconductor material positioned over the core and having a first radial thickness ($d_{abs}$) in the range of 0.2 microns to 1.0 microns; and a portion of a contiguous outer conductive layer positioned over the absorption layer, having a second radial thickness ($d_{ocl}$) in the range of 0.2 microns to 1.0 microns, and an index of refraction ($n_{ocl}$), wherein a combination of the substrate and the cores of the photovoltaic bristles is made of a base material portion and a metal layer that covers the base material portion, each core including a protruding portion of the metal layer, wherein the contiguous absorption layer is located over each of the cores of the photovoltaic bristles, wherein a bottommost layer within the contiguous absorption layer includes a horizontal portion located between the cores and overlies a portion of the metal layer that extends between the cores, wherein each bristle is configured such that:

$$\frac{n_{ocl} * r_c}{n_{amb} * (r_c + d_{abs} + d_{ocl})} \leq 1$$

wherein $n_{amb}$ is the index of refraction of an ambient material surrounding the bristles, wherein the photovoltaic bristles within the array of photovoltaic bristles are arranged such that an edge to edge spacing between neighboring photovoltaic bristles ($P_{EtoE}$) satisfies the equation:

$$((1.67*d_{abs}) + r_c)*(2)*(0.9) < P_{EtoE} ((1.67*d_{abs}) + r_c)*(2)*(1.1),$$

wherein the each photovoltaic bristle extends from a major surface of the substrate and has a longitudinal axis oriented transverse to the major surface of the substrate; and wherein the height of each photovoltaic bristle along the bristles longitudinal axis is in the range of 0.1 microns to 100 microns.

2. The photovoltaic cell of claim 1, wherein the second radial thickness ($d_{ocl}$) is smaller than the first radial thickness ($d_{abs}$).

3. The photovoltaic cell of claim 2, wherein the second radial thickness ($d_{ocl}$) is approximately two-thirds of the first radial thickness ($d_{abs}$).

4. The photovoltaic cell of claim 1, wherein the absorption layer comprises:
a p-type region; and
a n-type region, and
wherein the entire absorption layer, including the p-type region and the n-type region, is fully depleted.

5. The photovoltaic cell of claim 1, wherein the absorption layer comprises:
a p-type semiconductor sublayer over the core; and
an n-type semiconductor sublayer over the p-type semiconductor sublayer, and
wherein the entire absorption layer, including the p-type semiconductor sublayer and the n-type semiconductor sublayer, is fully depleted.

6. The photovoltaic cell of claim 1, wherein the absorption layer comprises:
a n-type semiconductor sublayer over the core; and
a p-type semiconductor sublayer over the n-type semiconductor sublayer, and
wherein the entire absorption layer, including the n-type semiconductor sublayer and the p-type semiconductor sublayer, is fully depleted.

7. The photovoltaic cell of claim 1, wherein an absorption layer index of refraction ($n_{abs}$) is greater than the outer conductive layer index of refraction ($n_{ocl}$).

8. The photovoltaic bristle of claim 1, wherein the absorption layer is made from semiconductor material selected from the group of silicon, amorphous silicon, polycrystalline silicon, single crystal silicon, cadmium telluride, gallium arsenide, aluminum gallium arsenide, cadmium sulfide, copper indium selenide, and copper indium gallium selenide.

9. The photovoltaic bristle of claim 1, wherein the outer conductive layer is made from one or more of zinc oxide, indium tin oxide, cadmium tin oxide, and titanium oxide.

10. The photovoltaic bristle of claim 1, wherein the outer conductive layer comprises a transparent conductive nitride.

11. The photovoltaic bristle of claim 1, wherein the outer conductive layer comprises multiple sublayers.

12. The photovoltaic bristle of claim 11, wherein the outer conductive layer comprises a conductive sublayer and a nonconductive sublayer.

13. The photovoltaic bristle of claim 11, wherein the outer conductive layer comprises two different conductive sublayers.

14. The photovoltaic bristle of claim 1, wherein the metal layer is made from one or more of gold, copper, nickel, molybdenum, iron, aluminum, and silver.

15. The photovoltaic bristle of claim 1, wherein the core comprises:
an inner core made from a non-conductive material; and
the metal layer surrounding the inner core.

16. The photovoltaic bristle of claim 1, wherein the core comprises one or more of silicon, amorphous silicon, polycrystalline silicon, single crystal silicon, cadmium telluride, gallium arsenide, gallium aluminum arsenide, cadmium sulfide, copper indium selenide, and copper indium gallium selenide.

17. The photovoltaic bristle of claim 1, wherein the core is a non-solid core.

18. The photovoltaic bristle of claim 1, wherein a height ($h_{min}$) of the photovoltaic bristles satisfies the equation:

$$h_{min} = \frac{(((1.67*d_{abs}) + r_c)*(2)*(0.9))}{\tan(40°)}.$$

19. The photovoltaic cell of claim 1, wherein the array of photovoltaic bristles defines a surface configured so that light energy conversion efficiency of the photovoltaic cell is greater when incident light strikes the surface at an angle less than ninety degrees than when incident light strikes the surface at an angle of approximately ninety degrees.

* * * * *